(12) United States Patent
Lin et al.

(10) Patent No.: US 11,823,949 B2
(45) Date of Patent: Nov. 21, 2023

(54) FINFET WITH SOURCE/DRAIN REGIONS COMPRISING AN INSULATOR LAYER

(71) Applicant: Taiwan Semiconductor Manufacturing Co., Ltd., Hsinchu (TW)

(72) Inventors: Tzu-Ching Lin, Hsinchu (TW); Tuoh Bin Ng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 319 days.

(21) Appl. No.: 17/316,119

(22) Filed: May 10, 2021

(65) Prior Publication Data
US 2021/0265196 A1 Aug. 26, 2021

Related U.S. Application Data

(62) Division of application No. 16/442,216, filed on Jun. 14, 2019, now Pat. No. 11,004,725.

(51) Int. Cl.
*H01L 21/764* (2006.01)
*H01L 29/08* (2006.01)
*H01L 29/66* (2006.01)
*H01L 29/06* (2006.01)
*H01L 29/78* (2006.01)

(52) U.S. Cl.
CPC ........ *H01L 21/764* (2013.01); *H01L 29/0653* (2013.01); *H01L 29/0847* (2013.01); *H01L 29/66545* (2013.01); *H01L 29/66636* (2013.01); *H01L 29/66795* (2013.01); *H01L 29/7851* (2013.01)

(58) Field of Classification Search
CPC ............ H01L 29/9653; H01L 29/0847; H01L 29/66545; H01L 29/66636; H01L 29/66795; H01L 29/7851; H01L 29/785; H01L 29/7848; H01L 21/764; H01L 21/76224; H01L 21/823814
See application file for complete search history.

(56) References Cited

U.S. PATENT DOCUMENTS

| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 10,361,278 | B2 | 7/2019 | Yang et al. |
| 10,868,181 | B2 * | 12/2020 | Li .................. H01L 21/823418 |

(Continued)

*Primary Examiner* — Didarul A Mazumder
*Assistant Examiner* — Gustavo G Ramallo
(74) *Attorney, Agent, or Firm* — Slater Matsil, LLP

(57) ABSTRACT

An embodiment is a device including a first fin extending from a substrate, a first gate stack over and along sidewalls of the first fin, a first gate spacer disposed along a sidewall of the first gate stack, and a first source/drain region in the first fin and adjacent the first gate spacer. The first source/drain region including a first insulator layer on the first fin, and a first epitaxial layer on the first insulator layer.

20 Claims, 23 Drawing Sheets

(56) References Cited

U.S. PATENT DOCUMENTS

| | | | |
|---|---|---|---|
| 2006/0131657 A1* | 6/2006 | Hamaguchi | H01L 29/6653 257/296 |
| 2017/0287910 A1* | 10/2017 | Fung | H01L 27/0886 |
| 2018/0151373 A1 | 5/2018 | Tsai et al. | |
| 2018/0151703 A1 | 5/2018 | Lin et al. | |
| 2019/0172927 A1 | 6/2019 | Jagannathan et al. | |
| 2020/0135591 A1 | 4/2020 | Yeong et al. | |
| 2020/0168723 A1 | 5/2020 | Hsu et al. | |

\* cited by examiner

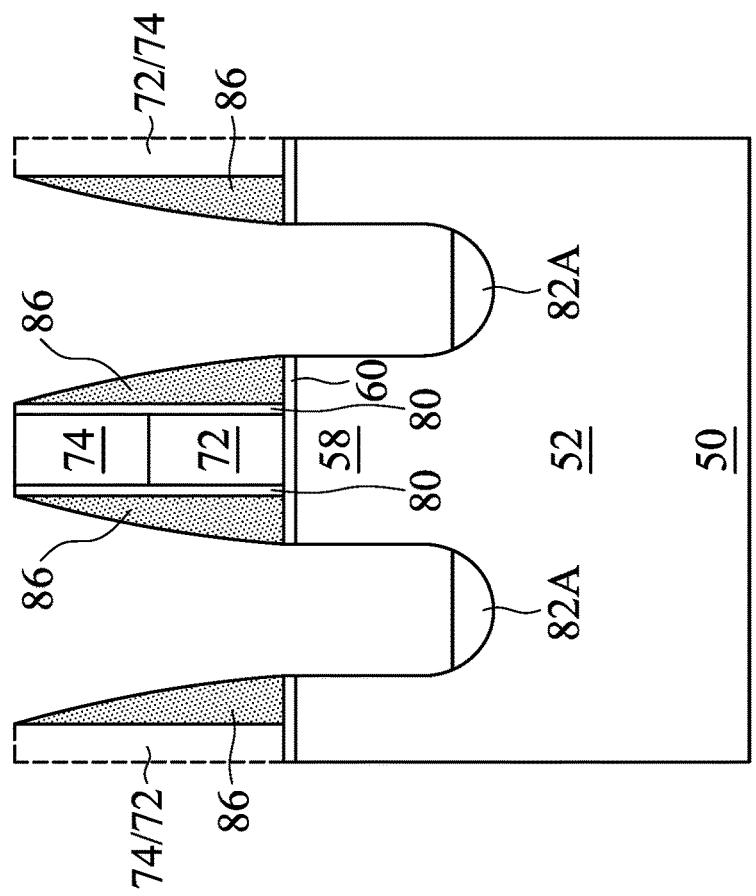
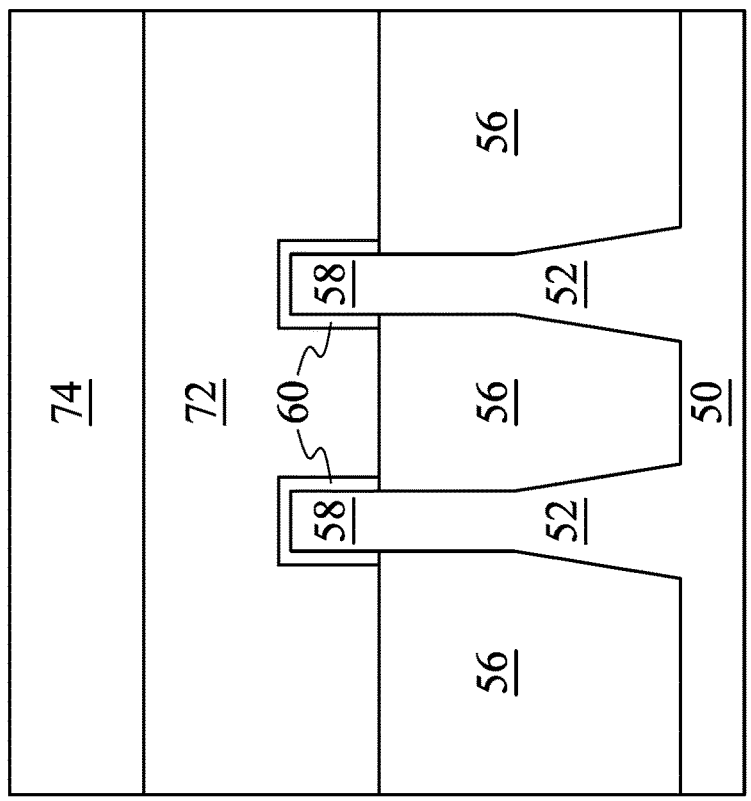
Figure 10A
Figure 10B

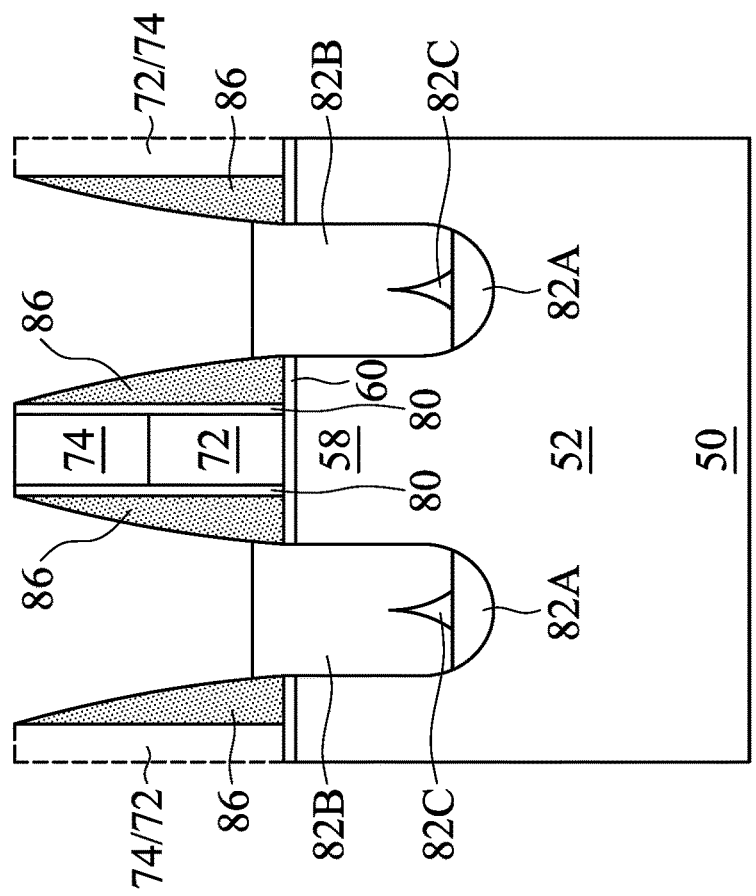
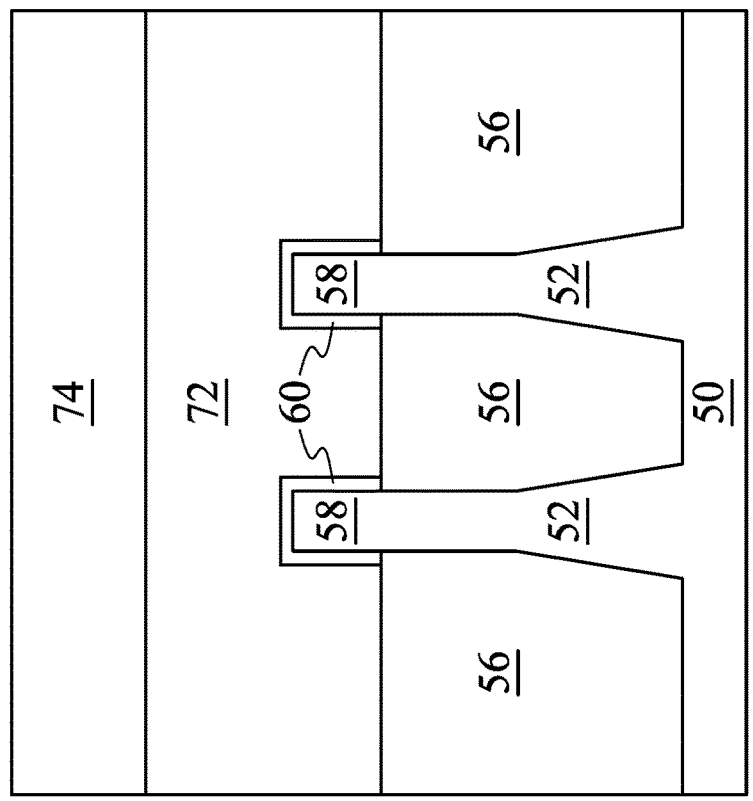
Figure 11B
Figure 11A

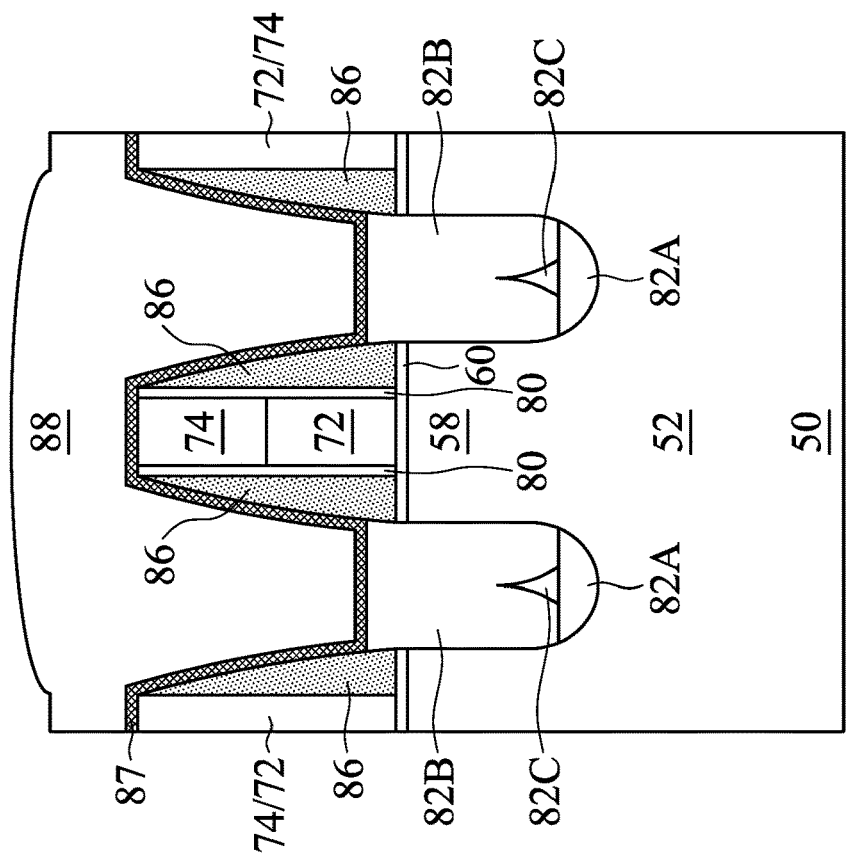
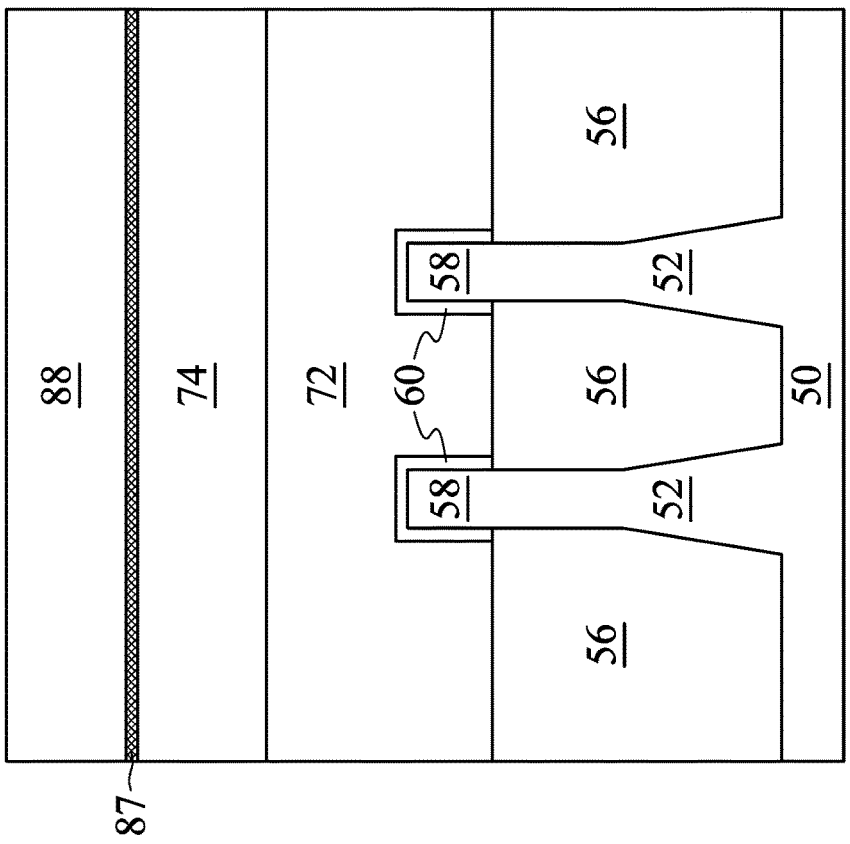
Figure 12B
Figure 12A

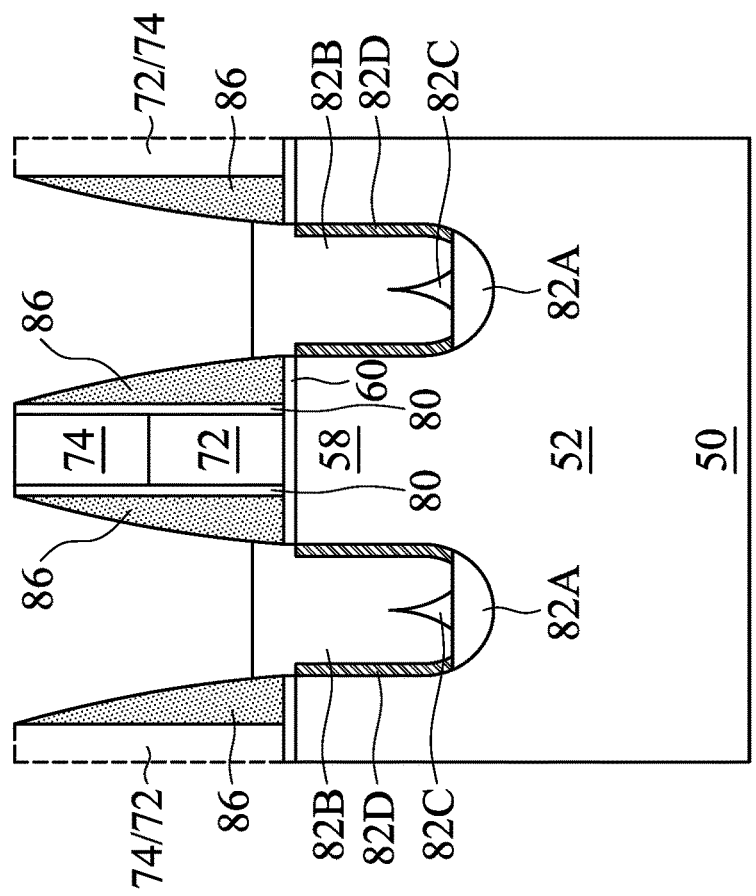
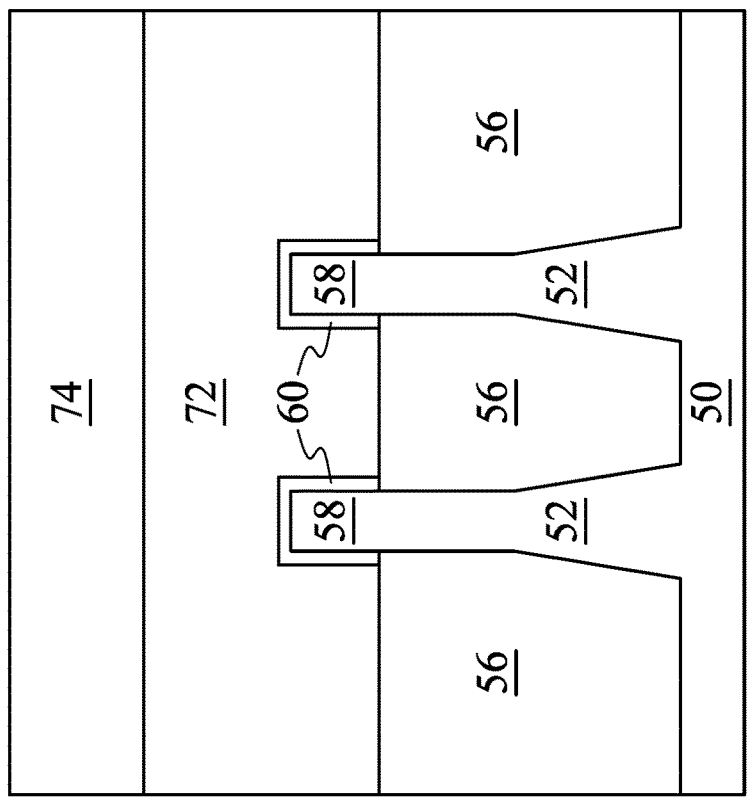
Figure 20A
Figure 20B

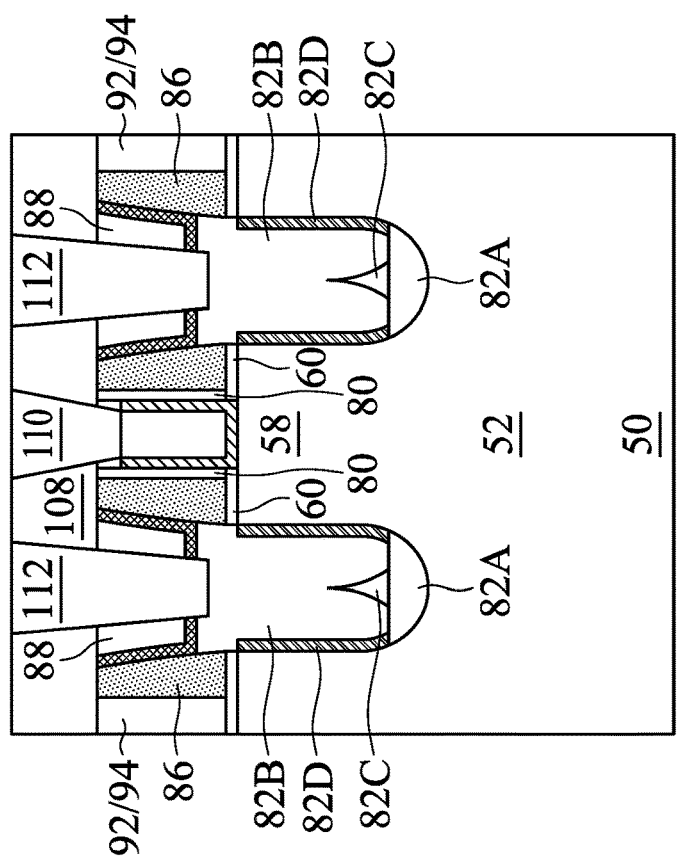
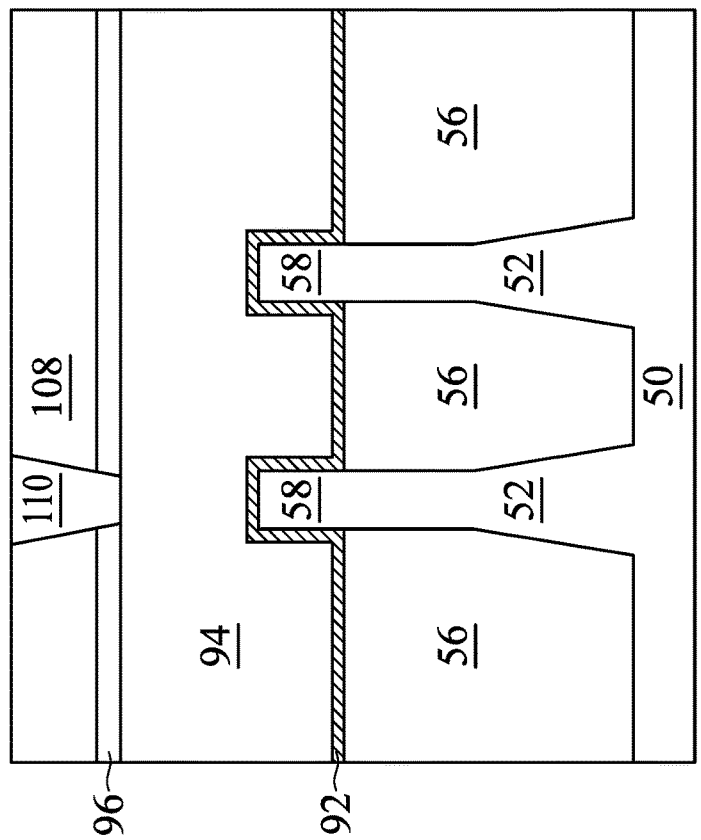
Figure 21B
Figure 21A

FINFET WITH SOURCE/DRAIN REGIONS COMPRISING AN INSULATOR LAYER

CROSS-REFERENCE TO RELATED APPLICATION

This application is a divisional of U.S. patent application Ser. No. 16/442,216, entitled "Method of Forming a FinFET Device with Gaps in the Source/Drain Region," filed on Jun. 14, 2019, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 11A, 11B, 11C, 11D, 12A, 12B, 13A, 13B, 14A, 14B, 15A, 15B, 15C, 16A, 16B, 17A, and 17B are cross-sectional views of intermediate stages in the manufacturing of FinFETs, in accordance with some embodiments.

FIGS. 18A, 18B, 19A, 19B, 20A, 20B, 21A, and 21B are cross-sectional views of intermediate stages in the manufacturing of FinFETs, in accordance with some embodiments.

DETAILED DESCRIPTION

Figure 1:
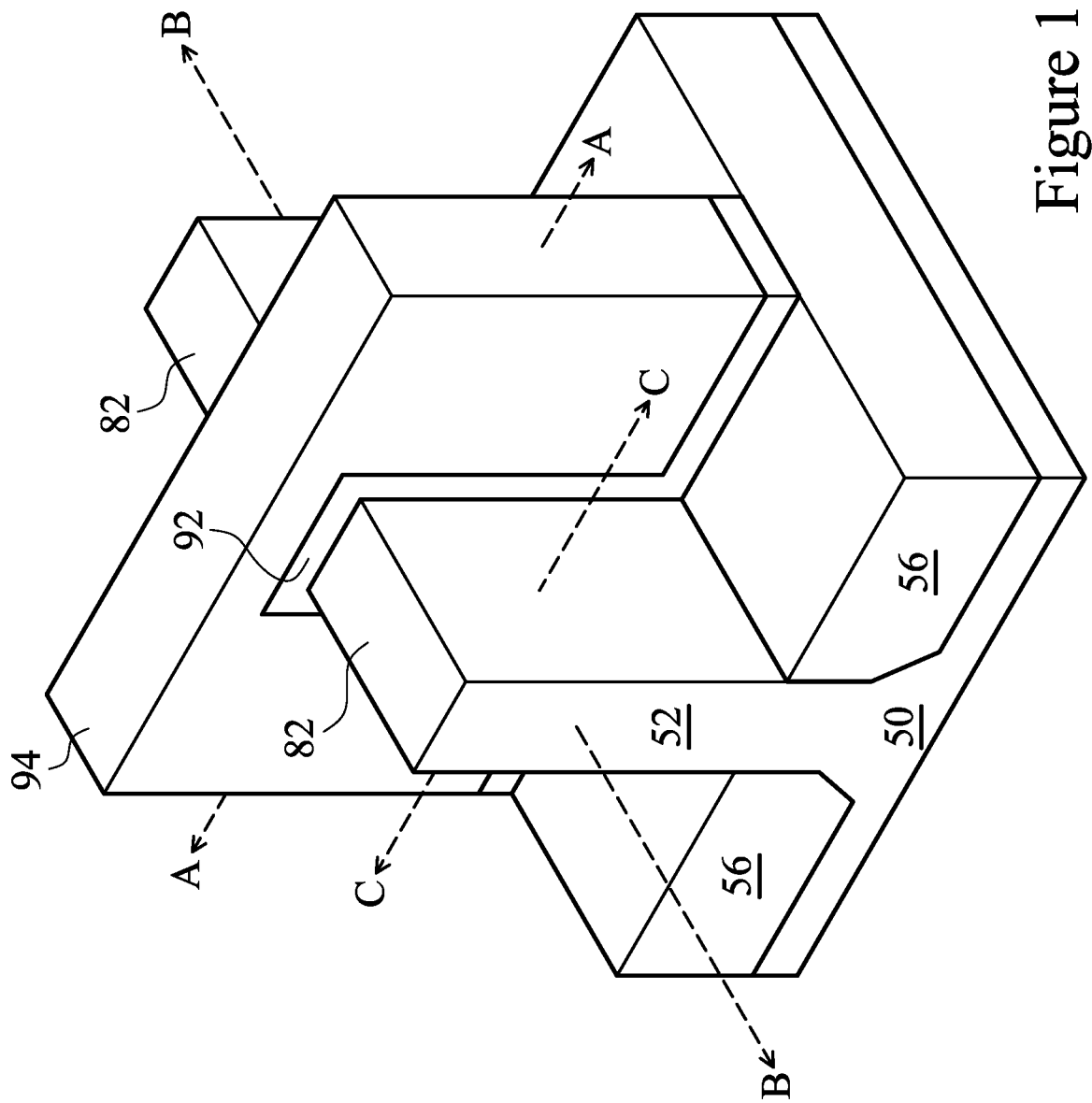
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. In other embodiments, a gate-first process may be used. Some variations of the embodiments are discussed. Also, some embodiments contemplate aspects used in planar devices, such as planar FETs. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to improve the performance of FinFET devices by reducing the leakage current and reducing the capacitance of the semiconductor device. In the disclosed embodiments, the source/drain regions include an insulator layer at the bottom to reduce the leakage current, which can lead to improved performance of the device. With the inclusion of the insulator layer, the conventional lower doped layer of the source/drains can be omitted, which can further lead to improved performance of the device. In addition, the insulator layer at the bottom of the source/drain regions can cause an air gap to form between the insulator layer and the epitaxial material of the source/drain regions. This air gap can reduce the capacitance of the device, which can enable a higher speed device. The disclosed processes and structures can improve the performance and reliability of the FinFET device.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Figure 11C:
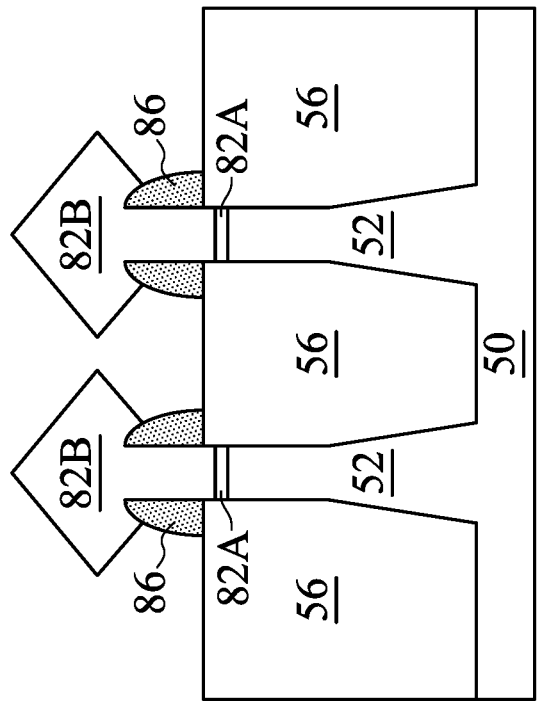
Figure 11D:
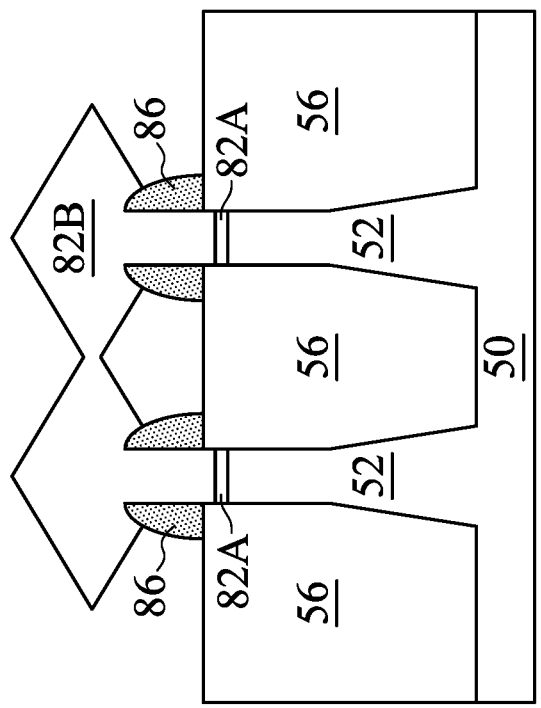

FIGS. 2 through 17B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, and 17A are illustrated along reference cross-section A-A illustrated in FIG. 1, and FIGS. 8B, 9B, 10B, 11B, 12B, 13B, 14B, 15B, 15C, 16B, and 17B are illustrated along a similar cross-section B-B illustrated in FIG. 1, except for multiple fins/FinFETs. FIGS. 11C and 11D are illustrated along reference cross-section C-C illustrated in FIG. 1, except for multiple fins/FinFETs.

Figure 2:
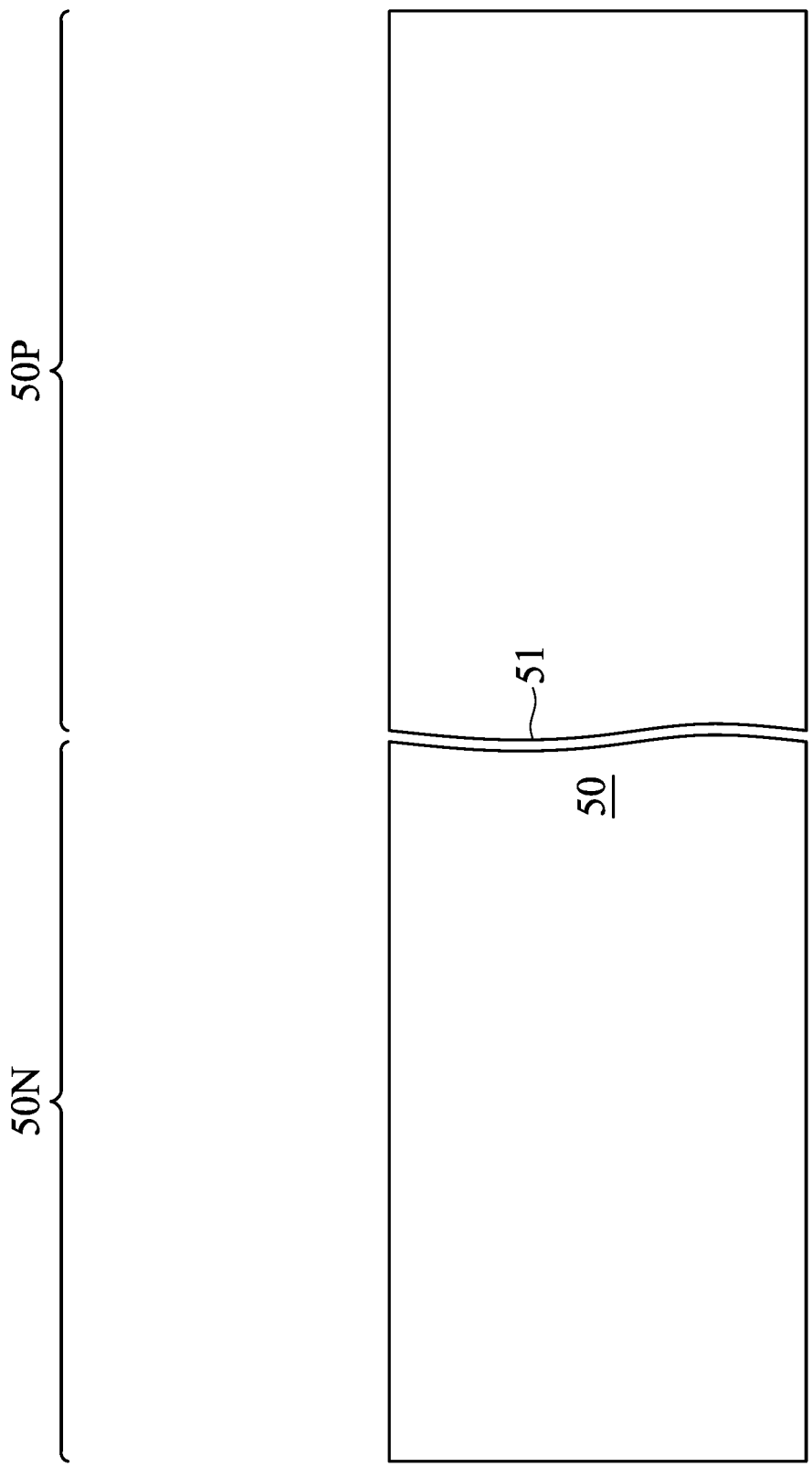

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
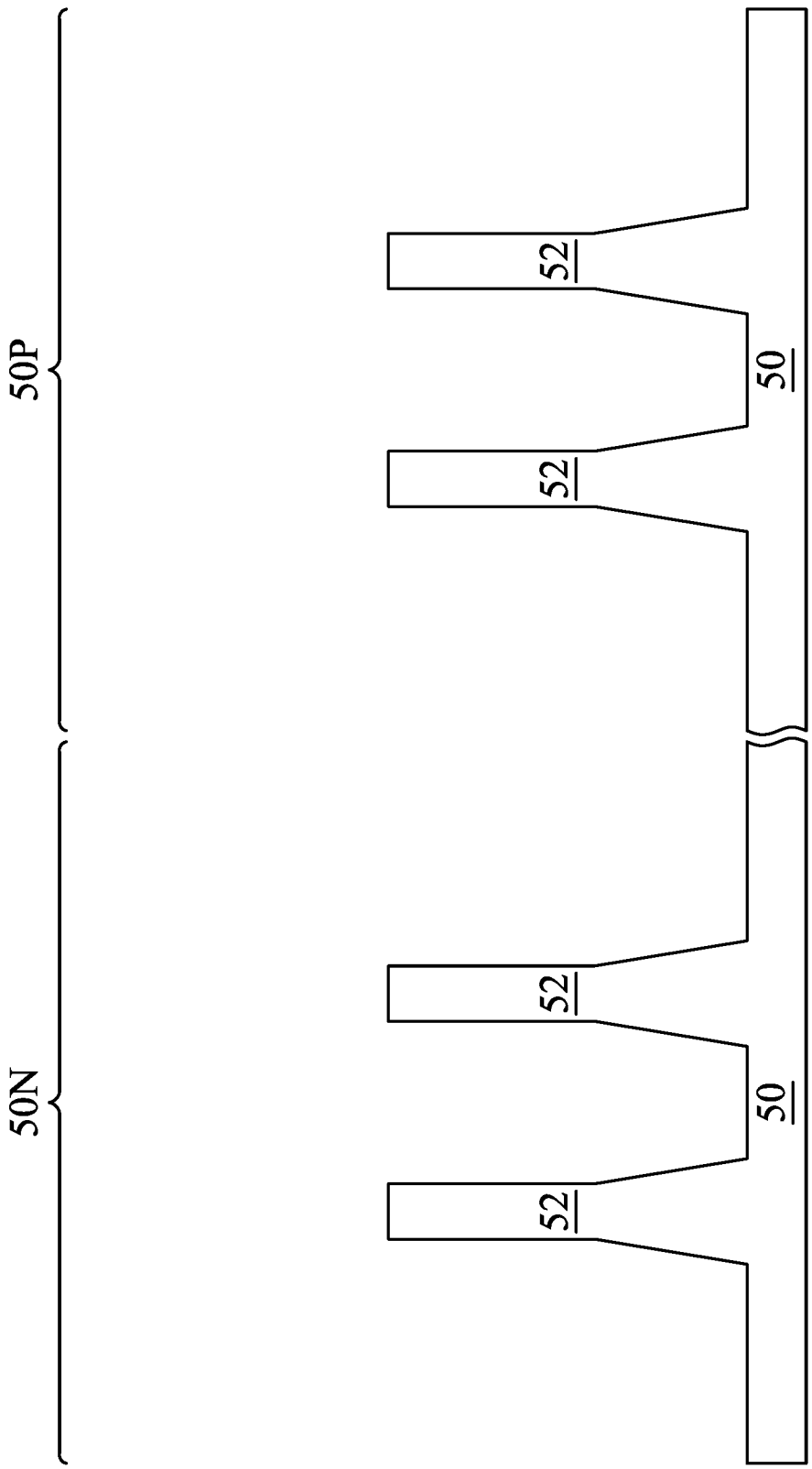

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
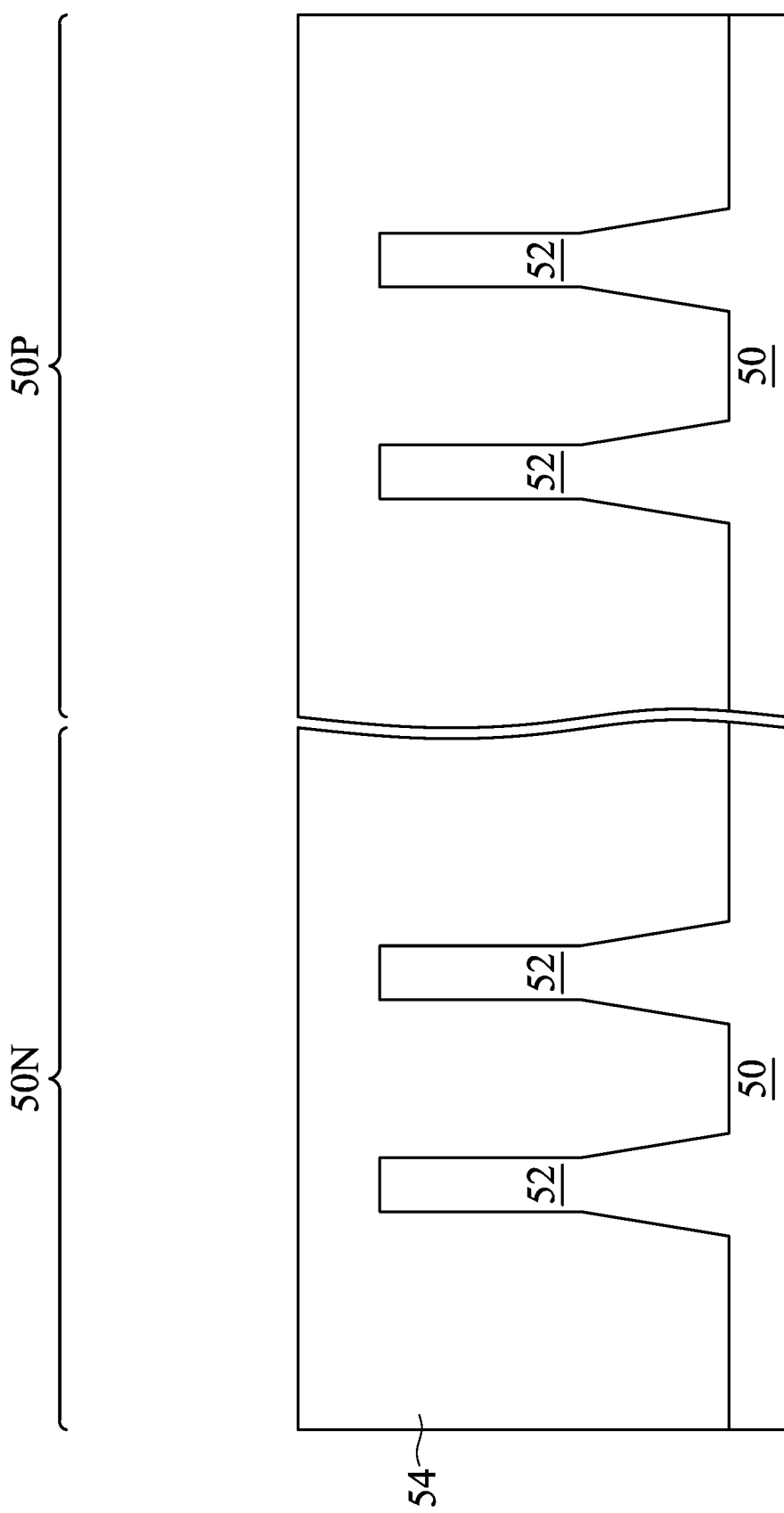

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
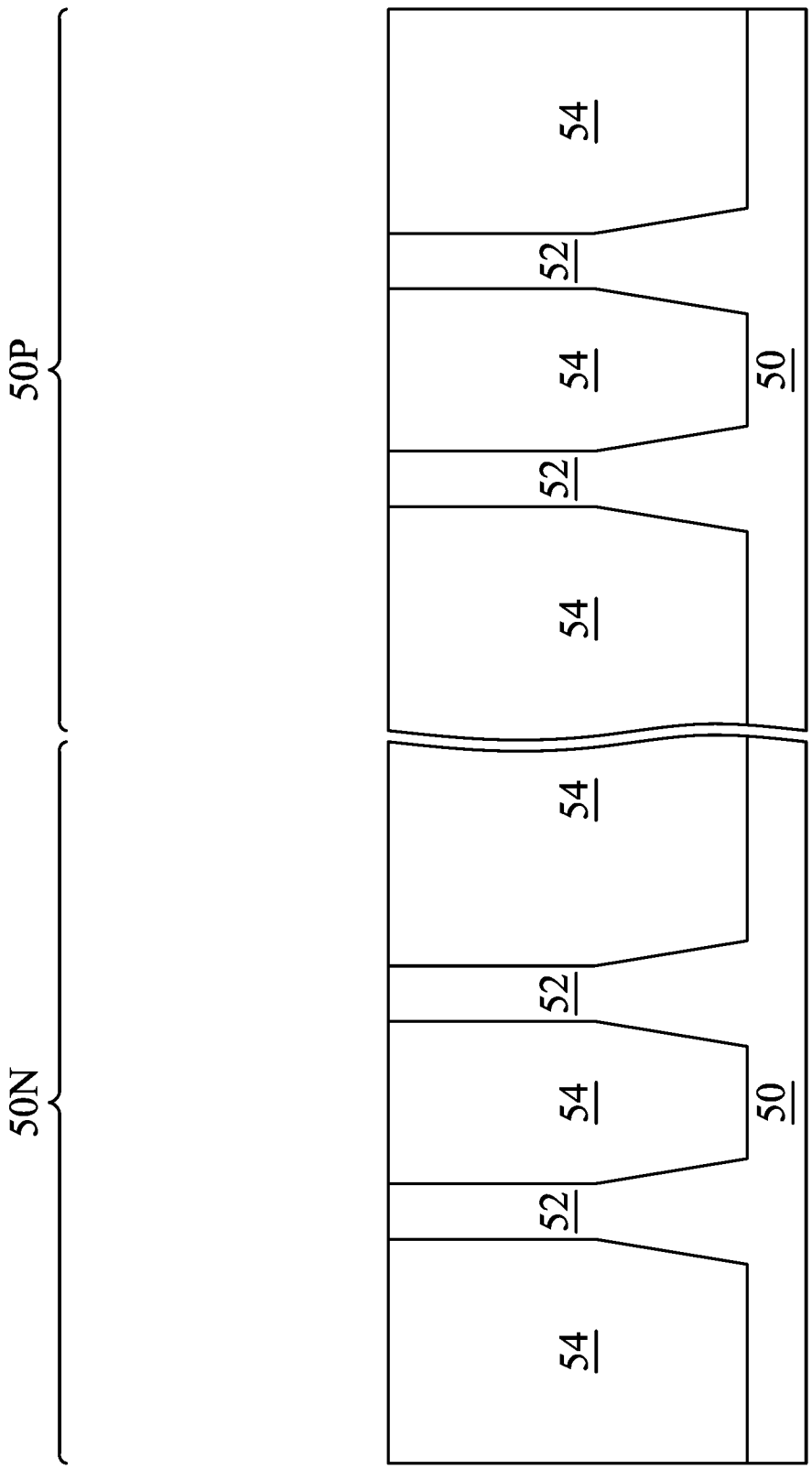

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
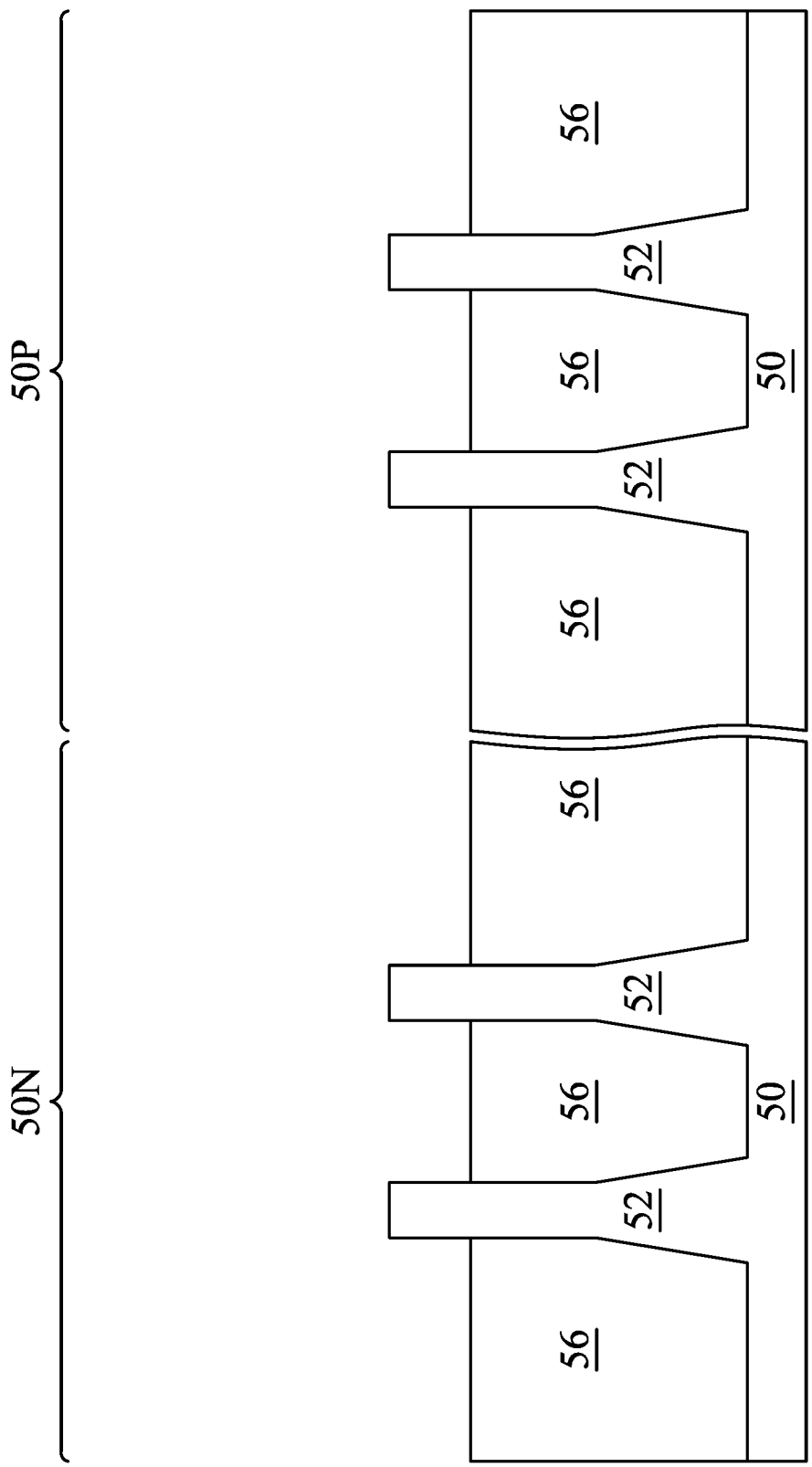

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
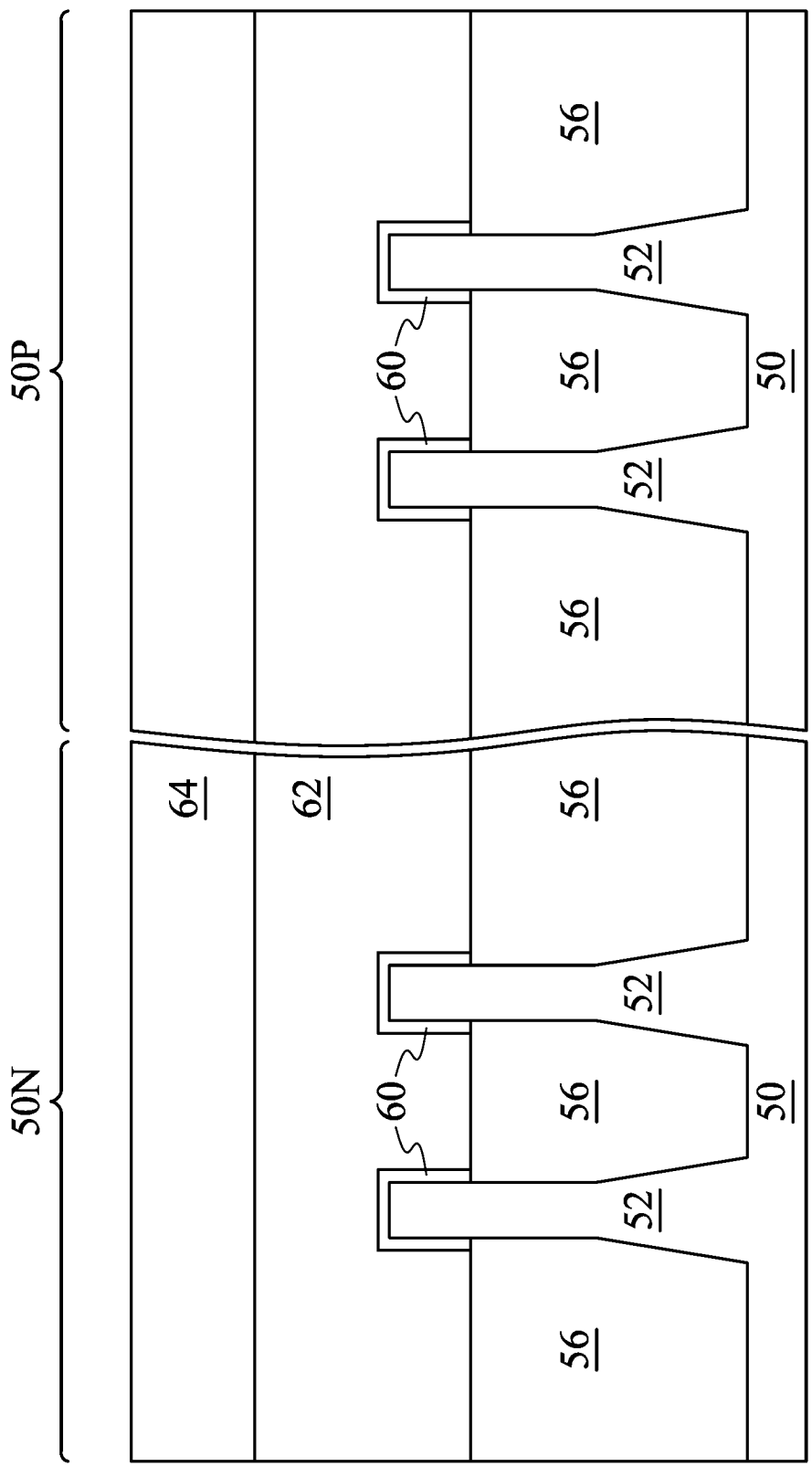

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 17B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
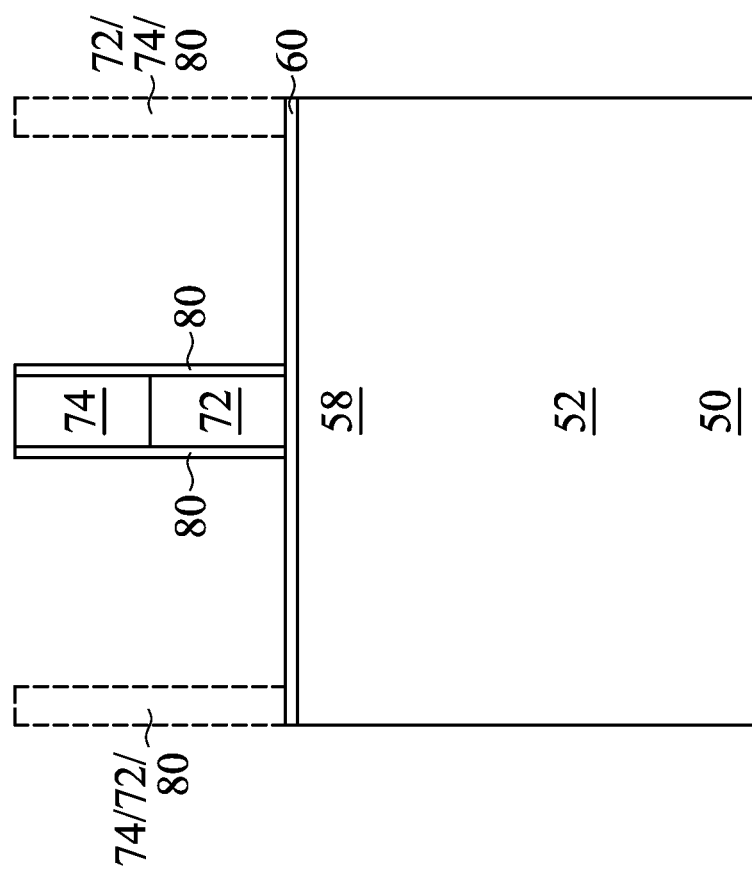
Figure 8A:
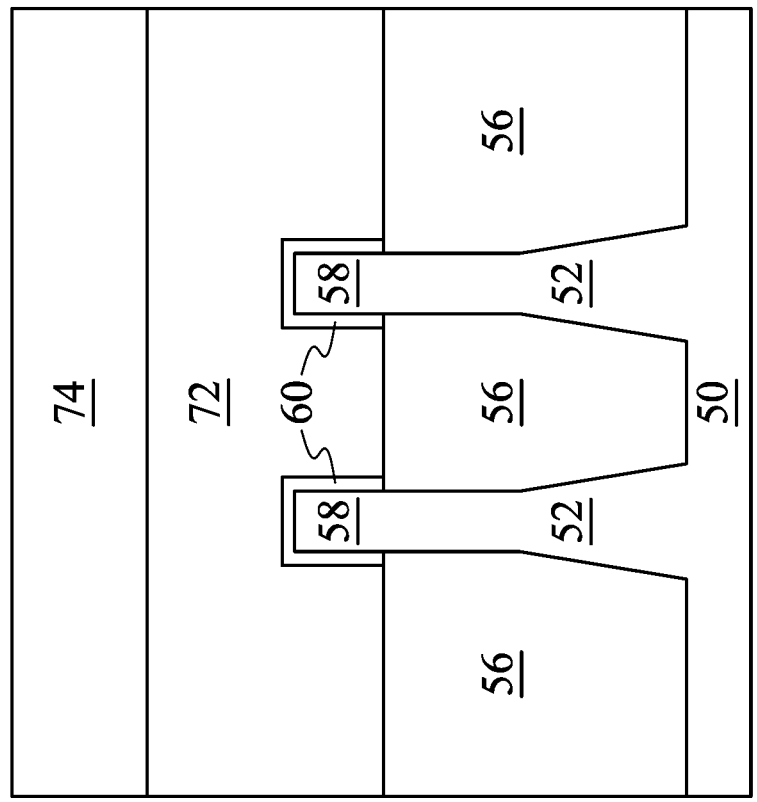

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
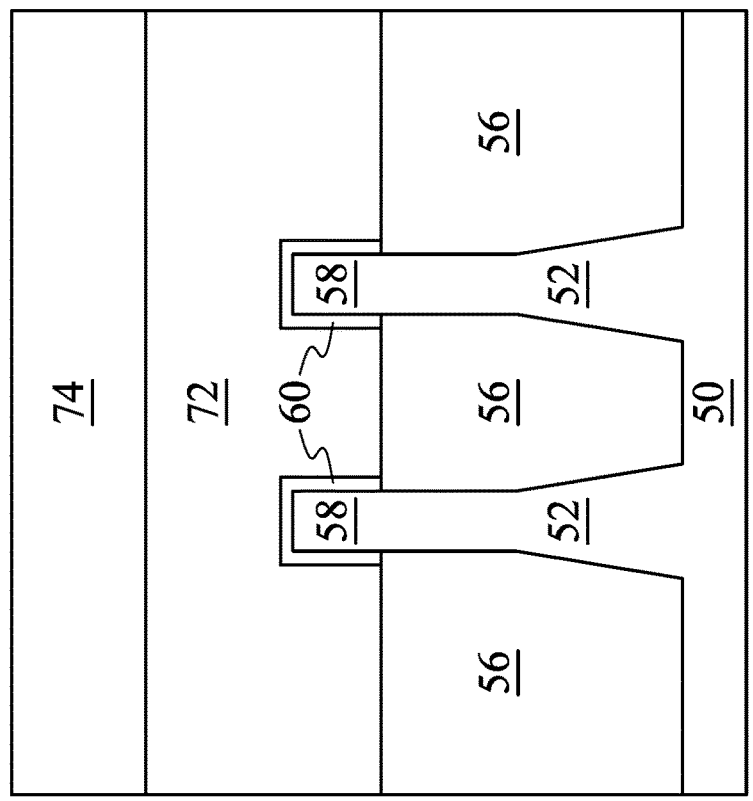
Figure 9A:
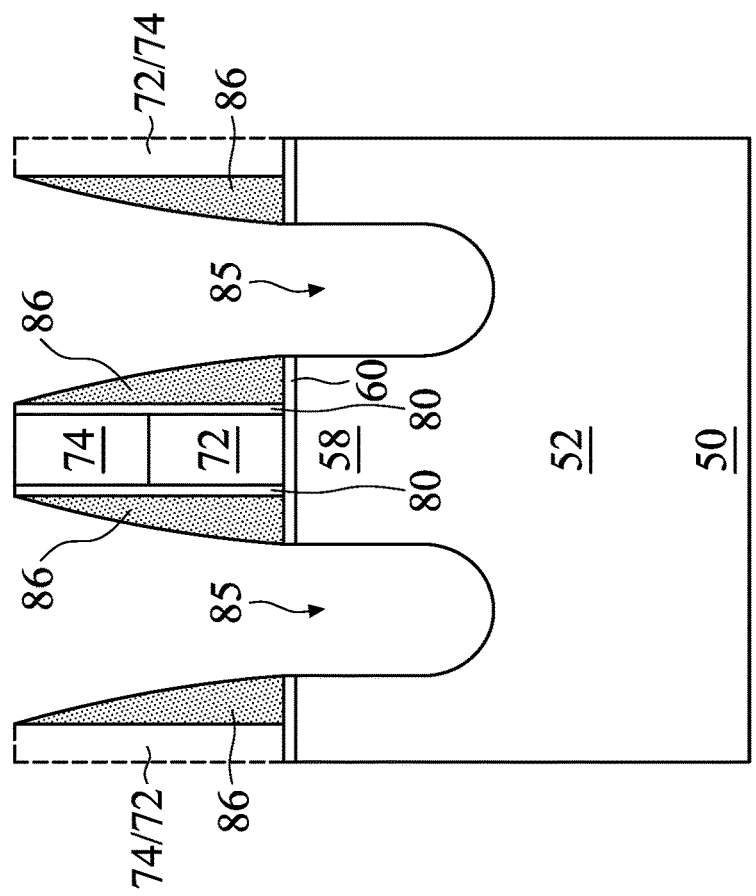

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 9A, 9B, 10A, 10B, 11A, 11B, 11C, and 11D source/drain regions 82 are formed in the fins 52 to exert stress in the respective channel regions 58, thereby improving performance. The source/drain regions 82 are formed in the fins 52 such that each dummy gate 72 is disposed between respective neighboring pairs of the source/drain regions 82. In some embodiments the source/drain regions 82 may extend into, and may also penetrate through, the fins 52. In some embodiments, the gate spacers 86 are used to separate the source/drain regions 82 from the dummy gates 72 by an appropriate lateral distance so that the source/drain regions 82 do not short out subsequently formed gates of the resulting FinFETs.

The formation of the source/drain regions 82 may be formed by distinct processes, such that the source/drain regions 82 may be different materials in each region and may be formed by distinct processes. Various masking steps may be used to mask and expose appropriate regions when using distinct processes.

Referring first to FIGS. 9A and 9B, a patterning process is performed on the fins 52 to form recesses 85 in source/drain regions of the fins 52. The patterning process may be performed in a manner that the recesses 85 are formed between neighboring dummy gate stacks 72/74 (in interior regions of the fins 52), or between an isolation region 56 and adjacent dummy gate stacks 72/74 (in end regions of the fins 52). In some embodiments, the patterning process may include a suitable anisotropic dry etching process, while using the dummy gate stacks 72/74, the gate spacers 86, and/or isolation regions 56 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including fluoromethane, methane, hydrogen bromide, oxygen, argon, a combination thereof, or the like. In some embodiments, the patterning process forms recesses 85 having U-shaped bottom surfaces. The recesses 85 may also be referred to as U-shaped recesses 85, an example recess 85 of which is shown in FIG. 9B. In some embodiments, the depth of the recesses 85 is in a range from about 35 nm to about 60 nm as measure from a top surface of the fin 52.

In FIGS. 10A, 10B, 11A, and 11B the source/drain regions 82 are formed in the recesses 85. In FIGS. 10A and 10B, an insulator layer 82A is formed in the recesses 85. The insulator layer 82A formed in the recesses 85 can reduce the leakage current and can reduce the capacitance of the semiconductor device. The insulator layer 82A may be formed of a dielectric material, and may be deposited by any suitable method, such as PVD, CVD, plasma-enhanced CVD (PECVD), or FCVD. Dielectric materials of the first insulator layer 82A may include silicon oxide, silicon nitride, hafnium oxide, the like, or a combination thereof. Other insulation materials formed by any acceptable process may be used. In some embodiments, the insulator layer 82A is formed in a non-conformal manner. For example, the top surface of the insulator layer 82A may be substantially planar and the bottom surface may be non-planar or curved. In some embodiments, the insulator layer 82A may be thicker at the bottom than at the sides. In some embodiments, the top surface of the insulator layer 82A may be non-planar, such as having a convex top surface.

In FIGS. 11A and 11B, an epitaxial layer 82B of the source/drain regions 82 is grown in the recesses 85. In the region 50N, e.g., the NMOS region, the epitaxial layer 82B may include any acceptable material, such as appropriate for n-type FinFETs. For example, if the fin 52 is silicon, the epitaxial layer 82B in the region 50N may include materials exerting a tensile strain in the channel region 58, such as silicon, silicon carbide, phosphorous doped silicon carbide, silicon phosphide, or the like. The epitaxial layer 82B in the region 50N may have surfaces raised from respective surfaces of the fins 52 and may have facets.

In the region 50P, e.g., the PMOS region, the epitaxial layer 82B may include any acceptable material, such as appropriate for p-type FinFETs. For example, if the fin 52 is silicon, the epitaxial layer 82B in the region 50P may comprise materials exerting a compressive strain in the channel region 58, such as silicon-germanium, boron doped silicon-germanium, germanium, germanium tin, or the like. The epitaxial layer 82B in the region 50P may also have surfaces raised from respective surfaces of the fins 52 and may have facets.

Due to the epitaxial layer 82B growing from the surfaces of the fin 52 and not growing from the insulator layer 82A, air gaps 82C can form between the insulator layer 82A and the epitaxial layer 82B. These air gaps 82C can reduce the capacitance of the device, which can enable a higher speed device. In some embodiments, the entire top surface of the air gap 82C is formed from bottom surfaces of the epitaxial layer 82B and the entire bottom surface of the air gap 82C is formed from a top surface the insulator layer 82A.

In some embodiments, a cap layer (not shown) of the source/drain regions 82 may be formed over the epitaxial layer 82B. The cap layer may include silicon phosphide or the like. The cap layer may be epitaxially grown on the epitaxial layer 82B and may have an impurity concentration lower than the impurity concentration in the epitaxial layer 82B.

The source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the source/drain regions 82 may be in situ doped during growth.

As a result of the epitaxy processes used to form the source/drain regions 82 in the region 50N and the region 50P, upper surfaces of the source/drain regions 82 have facets which expand laterally outward beyond sidewalls of the fins 52. In some embodiments, these facets cause adjacent epitaxial layers 82B of the source/drain regions 82 of a same FinFET to merge as illustrated by FIG. 11C. In other embodiments, adjacent epitaxial layers 82B of the source/drain regions 82 remain separated after the epitaxy process is completed as illustrated by FIG. 11D. In the embodiments illustrated in FIGS. 11C and 11D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 12A and 12B, a first interlayer dielectric (ILD) 88 is deposited over the structure illustrated in FIGS. 11A and 11B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial layer 82B of the source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 13B:
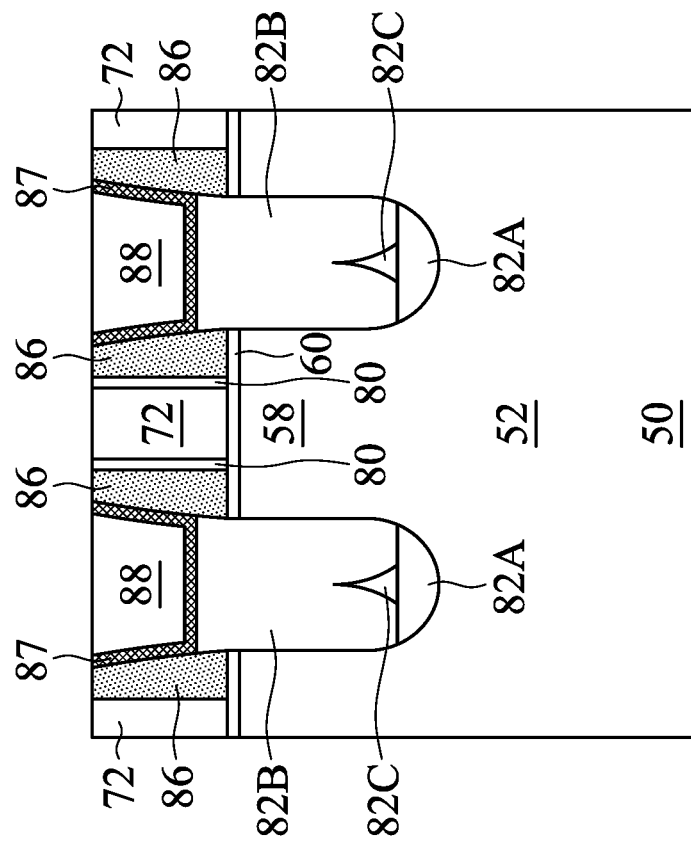
Figure 13A:
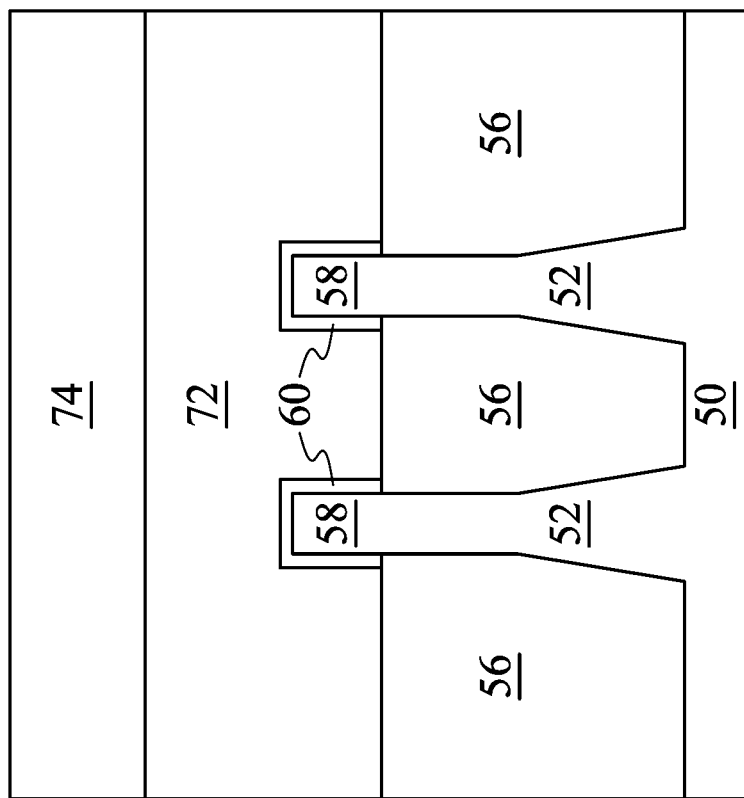

In FIGS. 13A and 13B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 14B:
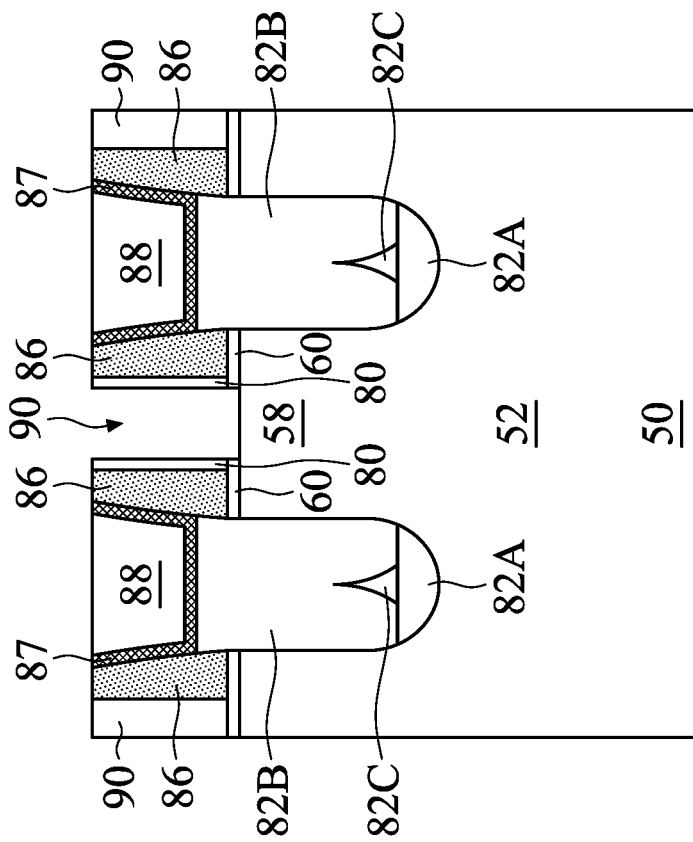
Figure 14A:
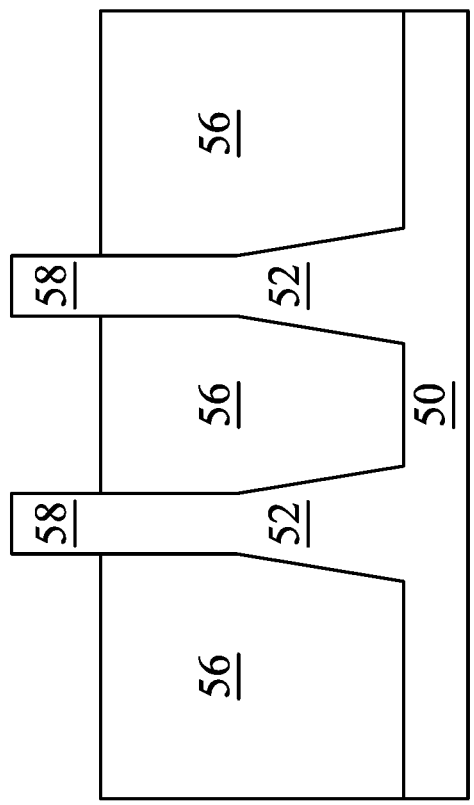

In FIGS. 14A and 14B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 15B:
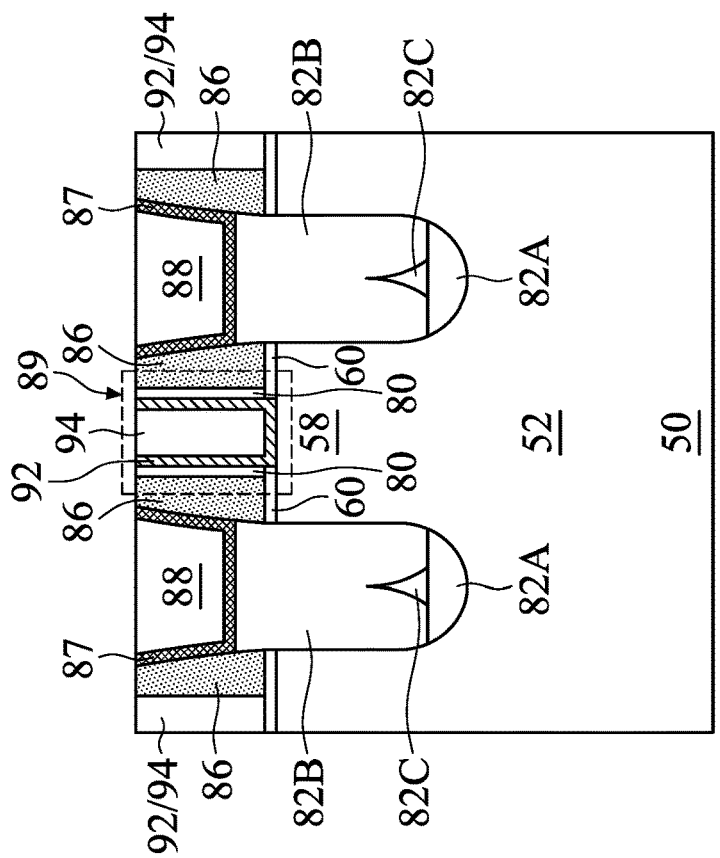
Figure 15A:
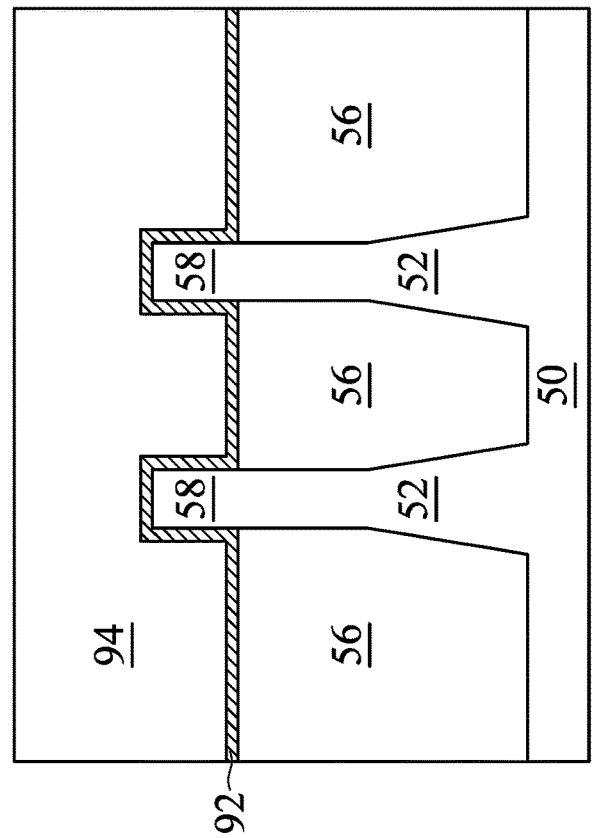
Figure 15C:
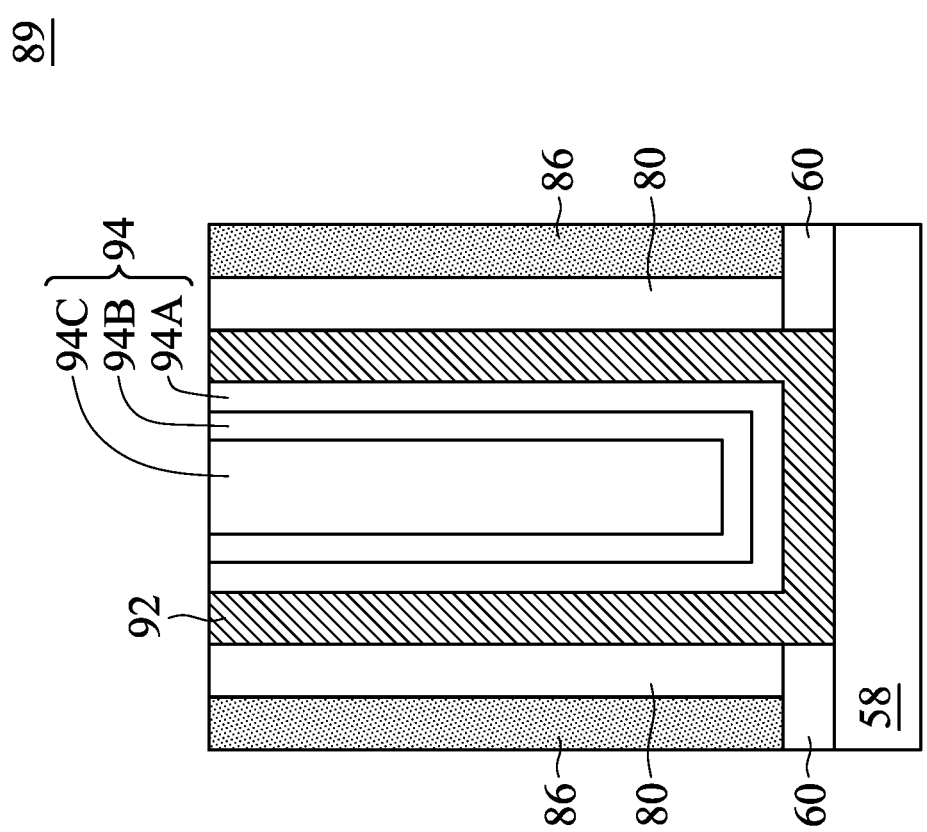

In FIGS. 15A and 15B, gate dielectric layers 92 and gate electrodes 94 are formed for replacement gates. FIG. 15C illustrates a detailed view of region 89 of FIG. 15B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include molecular-beam deposition (MBD), ALD, PECVD, and the like. In embodiments where portions of the dummy gate dielectric 60 remains in the recesses 90, the gate dielectric layers 92 include a material of the dummy gate dielectric 60 (e.g., silicon oxide).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 15B, the gate electrode 94 may comprise any number of liner layers 94A, any number of work function tuning layers 94B, and a fill material 94C as illustrated by FIG. 15C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 16B:
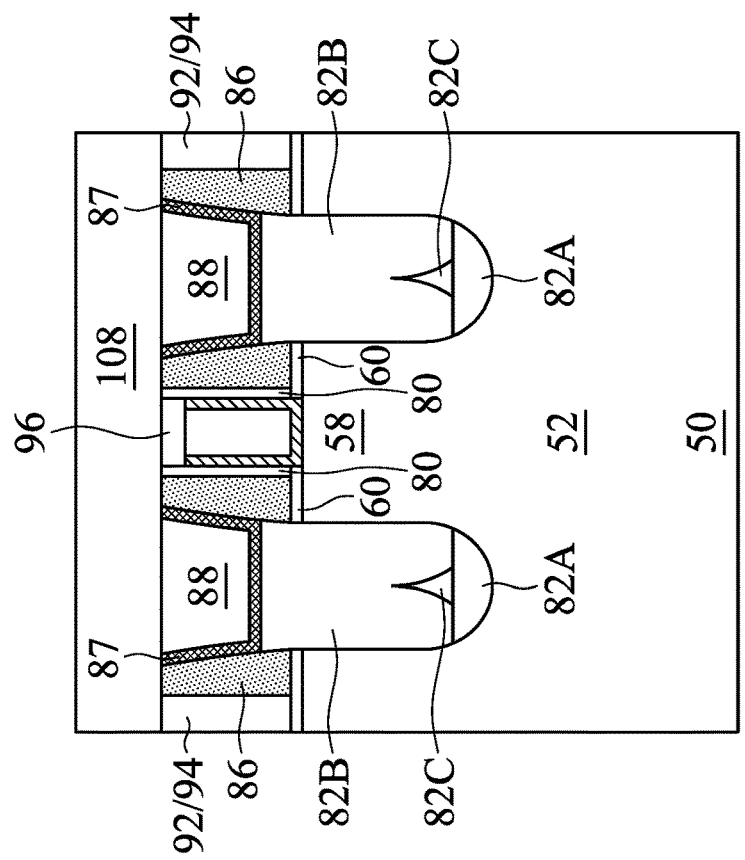
Figure 16A:
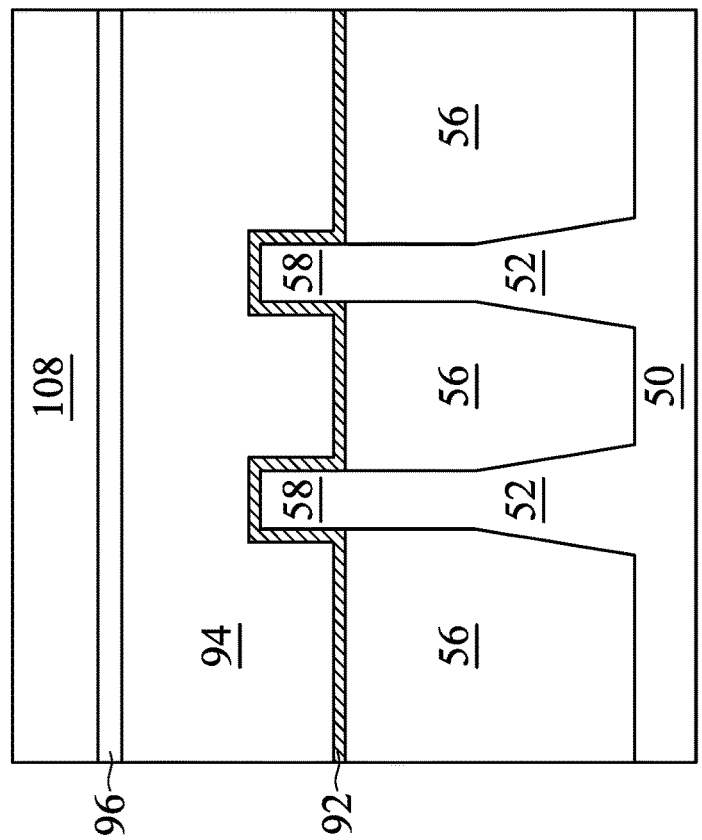

In FIGS. 16A and 16B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 16A and 16B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 17A and 17B) penetrate through the gate mask 96 to contact the top surface of the recessed gate electrode 94.

Figure 17B:
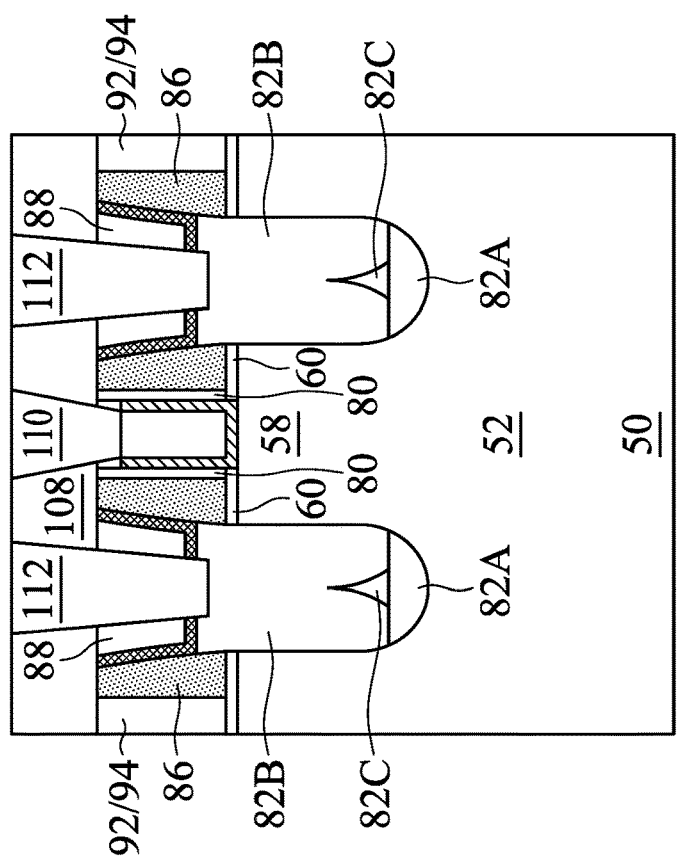
Figure 17A:
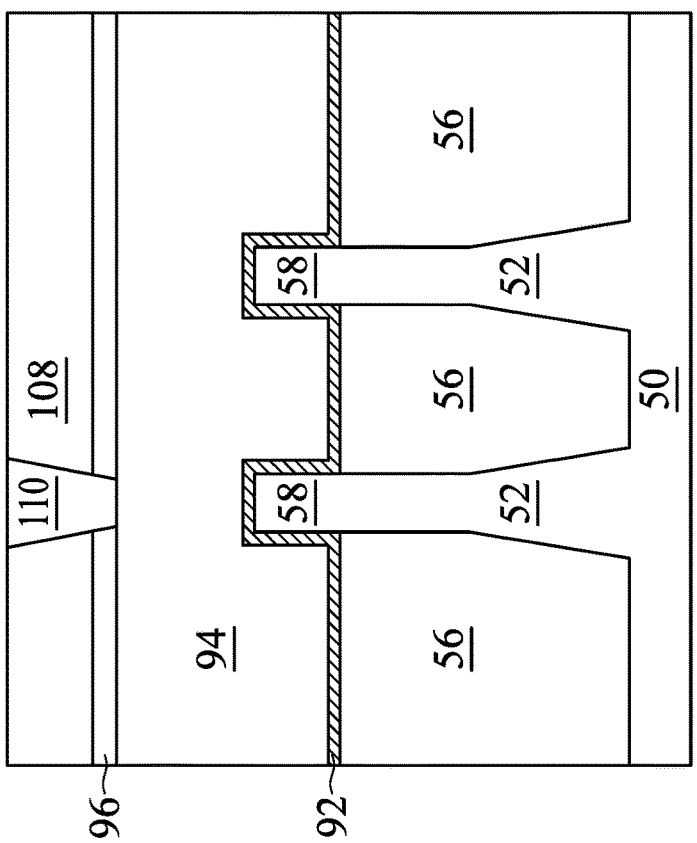

In FIGS. 17A and 17B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the source/drain regions 82 and the source/drain contacts 112. In some embodiments, the silicide may be formed of a titanium silicide or the like. The source/drain contacts 112 are physically and electrically coupled to the source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

FIGS. 18A, 18B, 19A, 19B, 20A, 20B, 21A, and 21B illustrate another configuration of the source/drain regions 82 in accordance with some embodiments. This embodiment is similar to the previous embodiment of FIGS. 1 through 17B except that in this embodiment, an epitaxial layer 82D is formed before the epitaxial layer 82B in the source/drain regions 82. Details regarding this embodiment that are similar to those for the previously described embodiment will not be repeated herein.

FIGS. 18A, 19A, 20A, and 21A are illustrated along reference cross-section A-A illustrated in FIG. 1, and FIGS. 18B, 19B, 20B, and 21B are illustrated along a similar cross-section B-B illustrated in FIG. 1, except for multiple fins/FinFETs.

Figure 18B:
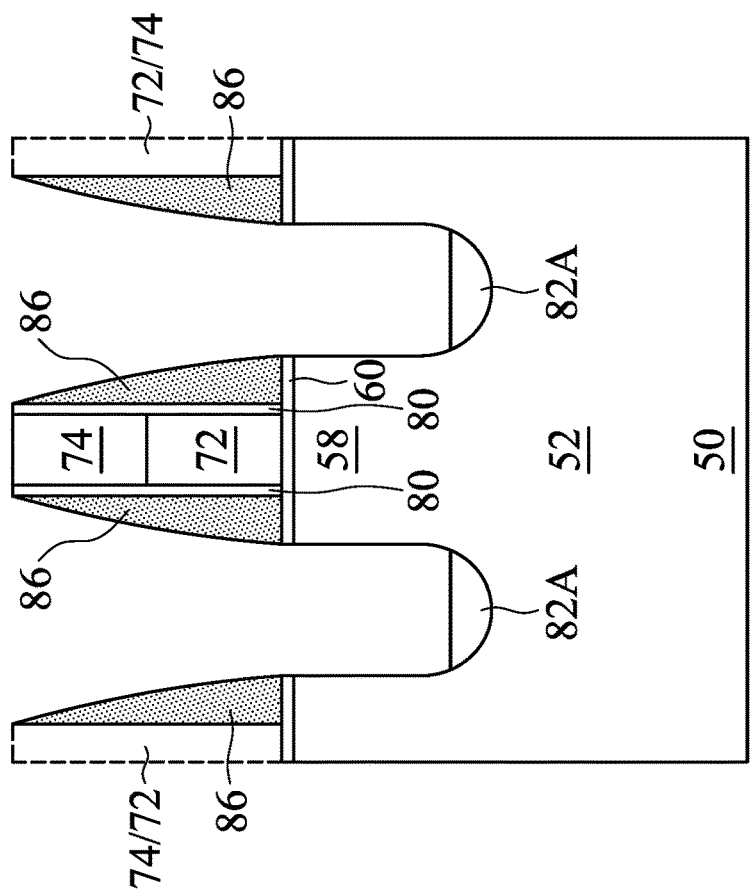
Figure 18A:
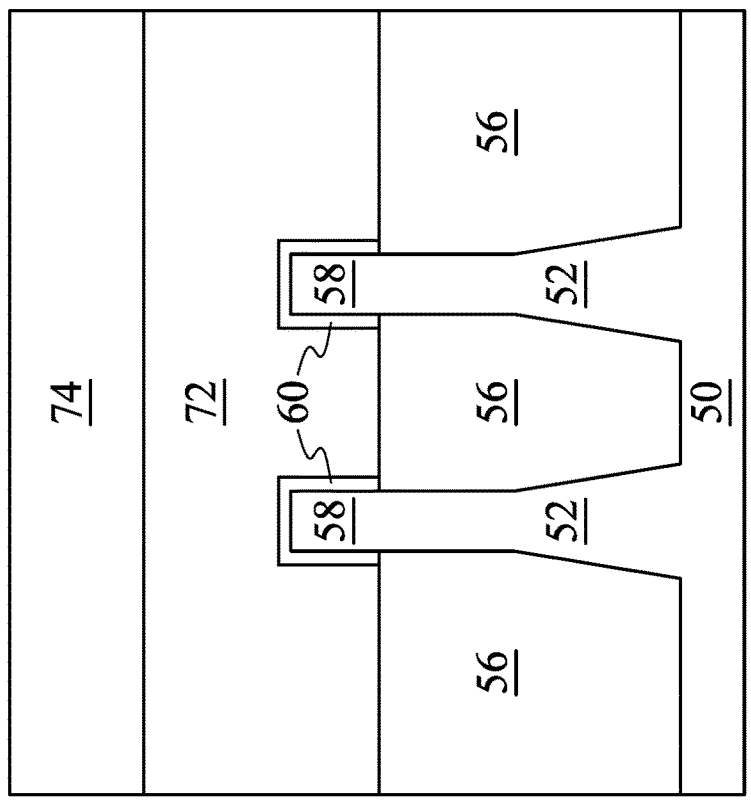
Figure 19B:
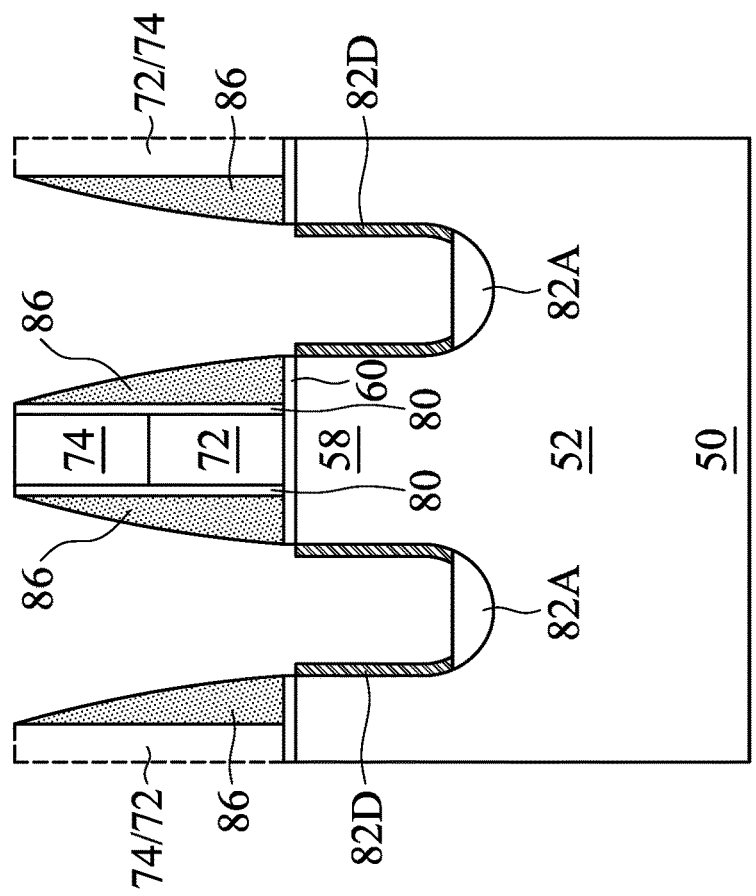
Figure 19A:
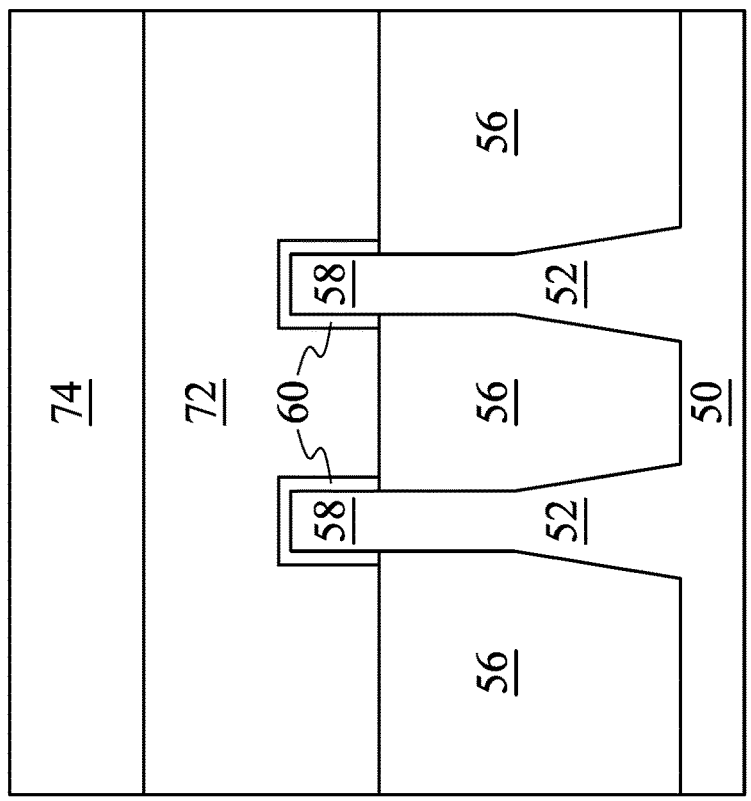

FIGS. 18A and 18B are an equivalent intermediate stage of processing as FIGS. 10A and 10B and the descriptions are not repeated herein. In FIGS. 19A and 19B, an epitaxial layer 82D of the source/drain regions 82 is grown in the recesses 85. The epitaxial layer 82D may have a substantially uniform thickness on the sidewalls the recesses 85. As illustrated in FIGS. 19A and 19B, the epitaxial layer 82D may only grow from the surfaces of the fin 52 and not grow from the insulator layer 82A.

In the region 50N, e.g., the NMOS region, the epitaxial layer 82D may include any acceptable material, such as appropriate for n-type FinFETs. For example, if the fin 52 is silicon, the epitaxial layer 82D in the region 50N may include materials exerting a tensile strain in the channel region 58, such as silicon, silicon carbide, phosphorous doped silicon carbide, silicon phosphide, or the like. The source/drain regions 82 in the region 50N may have surfaces raised from respective surfaces of the fins 52 and may have facets.

In the region 50P, e.g., the PMOS region, the epitaxial layer 82D may include any acceptable material, such as appropriate for p-type FinFETs. For example, if the fin 52 is silicon, the epitaxial layer 82B in the region 50P may comprise materials exerting a compressive strain in the channel region 58, such as silicon-germanium, boron doped silicon-germanium, germanium, germanium tin, or the like.

The epitaxial layer 82D in the region 50P may also have surfaces raised from respective surfaces of the fins 52 and may have facets.

In both regions 50N and 50P, the epitaxial layer 82D may have an impurity concentration lower than the impurity concentration in the respective epitaxial layer 82B.

In FIGS. 20A and 20B, an epitaxial layer 82B of the source/drain regions 82 is grown in the recesses 85 from the epitaxial layer 82D. The epitaxial layer 82B may grow from the surfaces of the epitaxial layer 82D to completely cover the epitaxial layer 82D.

In the region 50N, e.g., the NMOS region, the epitaxial layer 82B may include any acceptable material, such as appropriate for n-type FinFETs. For example, if the fin 52 is silicon, the epitaxial layer 82B in the region 50N may include materials exerting a tensile strain in the channel region 58, such as silicon, silicon carbide, phosphorous doped silicon carbide, silicon phosphide, or the like. The epitaxial layer 82B in the region 50N may have surfaces raised from respective surfaces of the fins 52 and may have facets.

In the region 50P, e.g., the PMOS region, the epitaxial layer 82B may include any acceptable material, such as appropriate for p-type FinFETs. For example, if the fin 52 is silicon, the epitaxial layer 82B in the region 50P may comprise materials exerting a compressive strain in the channel region 58, such as silicon-germanium, boron doped silicon-germanium, germanium, germanium tin, or the like. The epitaxial layer 82B in the region 50P may also have surfaces raised from respective surfaces of the fins 52 and may have facets.

Due to the epitaxial layer 82B growing from the surfaces of the epitaxial layer 82D and not growing from the insulator layer 82A, air gaps 82C can form between the insulator layer 82A and the epitaxial layer 82B. These air gaps 82C can reduce the capacitance of the device, which can enable a higher speed device. In some embodiments, the entire top surface of the air gap 82C is formed from bottom surfaces of the epitaxial layer 82B and the entire bottom surface of the air gap 82C is formed from a top surface the insulator layer 82A. In some embodiments, the top surface of the air gap 82C is formed from bottom surfaces of both of the epitaxial layers 82B and 82D and the entire bottom surface of the air gap 82C is formed from a top surface the insulator layer 82A.

In some embodiments, a cap layer (not shown) of the source/drain regions 82 may be formed over the epitaxial layer 82B. The cap layer may include silicon phosphide or the like. The cap layer may be epitaxially grown on the epitaxial layer 82B and may have an impurity concentration lower than the impurity concentration in the epitaxial layer 82B.

FIGS. 21A and 22B illustrates further processing on the structure of FIGS. 20A and 20B. The processing between these two figures is similar to the processing illustrated and described above in reference to FIGS. 11A and 11B through FIGS. 17A and 17B with FIGS. 17A and 17B being an equivalent intermediate stage as FIGS. 21A and 22B and the descriptions are not repeated herein.

Embodiments may achieve advantages. The disclosed embodiments improve the performance of FinFET devices by reducing the leakage current and reducing the capacitance of the semiconductor device. In the disclosed embodiments, the source/drain regions include an insulator layer at the bottom to reduce the leakage current, which can lead to improved performance of the device. With the inclusion of the insulator layer, the conventional lower doped layer of the source/drains can be omitted, which can further lead to improved performance of the device. In addition, the insulator layer at the bottom of the source/drain regions can cause an air gap to form between the insulator layer and the epitaxial material of the source/drain regions. This air gap can reduce the capacitance of the device, which can enable a higher speed device. The disclosed processes and structures can improve the performance and reliability of the FinFET device.

In an embodiment, a device includes a first fin extending from a substrate, a first gate stack over and along sidewalls of the first fin, a first gate spacer disposed along a sidewall of the first gate stack, and a first source/drain region in the first fin and adjacent the first gate spacer, the first source/drain region includes a first insulator layer on the first fin, and a first epitaxial layer on the first insulator layer.

Embodiments may include one or more of the following features. The device where the first insulator layer is thicker at a bottom than at sides of the first source/drain region. The device further includes an air gap between the first insulator layer and the first epitaxial layer. The device where the air gap has a planar bottom surface and a non-planar top surface. The device where the first epitaxial layer has a faceted top surface. The device further includes an etch stop layer over the first source/drain region and on a sidewall of the first gate spacer, a first interlayer dielectric over the etch stop layer, a second interlayer dielectric over the first interlayer dielectric, and a first conductive contact extending through the first and second interlayer dielectrics and the etch stop layer, the first conductive contact being electrically coupled to the first source/drain region. The device where the first epitaxial layer contacts the first gate spacer. The device where the first source/drain region further includes a second epitaxial layer between and contacting the first epitaxial layer and the first fin, the second epitaxial layer contacting the first insulator layer. The device where the first insulator layer includes silicon oxide, silicon nitride, hafnium oxide, or a combination thereof.

In an embodiment, a method includes depositing a first dummy gate over and along sidewalls of a first fin extending upwards from a substrate, forming a first gate spacer along a sidewall of the first dummy gate, forming a first recess in the first fin adjacent the first gate spacer, and forming a first source/drain region in the first recess, the forming the first source/drain region includes depositing a first insulator layer in the first recess, and epitaxially growing a first layer in the first recess, the first layer being over the first insulator layer.

Embodiments may include one or more of the following features. The method where the first insulator layer is thicker at a bottom than at sides of the first source/drain region. The method where epitaxially growing a first layer in the first recess further includes epitaxially growing the first layer from sidewalls of the first recess, where after epitaxially growing the first layer, an air gap is between the first insulator layer and the first layer. The method further includes replacing the first dummy gate with a functional gate stack disposed over and along sidewalls of the first fin. The method where the first layer has a faceted top surface raised above an upper surface of the first fin. The method where forming the first source/drain region in the first recess further includes epitaxially growing a second layer from the first fin in the first recess, where the first layer is epitaxially grown from the second layer, the second layer being between and contacting the first layer and the first fin, the second layer contacting the first insulator layer. The method where after epitaxially growing the first layer, an air gap is between the first insulator layer and the first layer.

In an embodiment, a method includes forming a first dummy gate over and along sidewalls of a first fin extending upwards from a substrate, forming a first gate spacer along a sidewall of the first dummy gate, etching a first recess in the first fin adjacent the first gate spacer, forming a first source/drain region in the first recess, the first source/drain region including a first insulator layer, a first epitaxial layer, and a second epitaxial layer, the first insulator layer being deposited in the first recess, where after the first insulator layer is formed, the first fin being exposed at sidewalls of the first recess, the first epitaxial layer being grown from the exposed first fin in the first recess, and the second epitaxial layer being grown from the first epitaxial layer, where after growing the second epitaxial layer, an air gap is between the first insulator layer and the second epitaxial layer, and replacing the first dummy gate with a functional gate stack disposed over and along sidewalls of the first fin.

Embodiments may include one or more of the following features. The method where the air gap has a planar bottom surface and a non-planar top surface. The method where the second epitaxial layer has a faceted top surface. The method further includes forming an etch stop layer over the first source/drain region and on a sidewall of the first gate spacer, forming a first interlayer dielectric over the etch stop layer, forming a second interlayer dielectric over the first interlayer dielectric, etching a hole through the first and second interlayer dielectrics and the etch stop layer, and forming a first conductive contact in the hole, the first conductive contact being electrically coupled to the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin extending from a substrate;
a first gate stack over and along sidewalls of the first fin;
a first gate spacer disposed along a sidewall of the first gate stack; and
a first source/drain region in the first fin and adjacent the first gate spacer, the first source/drain region comprising:
a first insulator layer on the first fin;
a first epitaxial layer on the first insulator layer; and
a second epitaxial layer contacting the first insulator layer and the first epitaxial layer.

2. The device of claim 1, wherein the first insulator layer is thicker at a bottom than at sides of the first source/drain region.

3. The device of claim 1 further comprising:
an air gap between the first insulator layer and the first epitaxial layer.

4. The device of claim 3, wherein the air gap has a planar bottom surface and a non-planar top surface.

5. The device of claim 1, wherein the first epitaxial layer has a faceted top surface.

6. The device of claim 1 further comprising:
an etch stop layer over the first source/drain region and on a sidewall of the first gate spacer;
a first interlayer dielectric over the etch stop layer;
a second interlayer dielectric over the first interlayer dielectric; and
a first conductive contact extending through the first and second interlayer dielectrics and the etch stop layer, the first conductive contact being electrically coupled to the first source/drain region.

7. The device of claim 1, wherein the first epitaxial layer contacts the first gate spacer.

8. The device of claim 1, wherein the second epitaxial layer is between and contacting the first epitaxial layer and the first fin.

9. The device of claim 1, wherein the first insulator layer comprises silicon oxide, silicon nitride, hafnium oxide, or a combination thereof.

10. A device comprising:
a fin extending from a substrate;
a first gate over and along sidewalls of a first fin;
gate spacers along sidewalls of the first gate;
a first source/drain region in the first fin adjacent a first one of the gate spacers, the first source/drain region comprising:
a first insulator layer;
a first semiconductor layer over the first insulator layer and on the fin;
a second semiconductor layer over the first insulator layer and the first semiconductor layer, the second semiconductor layer having a higher impurity concentration than the first semiconductor layer; and
a gap between the first insulator layer and the second semiconductor layer, the gap being completely surrounded by the first insulator layer and the second semiconductor layer.

11. The device of claim 10, wherein the first semiconductor layer is a conformal layer, and wherein the second semiconductor layer is not a conformal layer.

12. The device of claim 10, wherein the second semiconductor layer contacts the first one of the gate spacers.

13. The device of claim 10, wherein the second semiconductor layer has a faceted top surface raised above an upper surface of the first fin.

14. The device of claim 10, wherein the first insulator layer is thicker at a bottom than at sides of the first source/drain region.

15. The device of claim 10, wherein the gap has a planar bottom surface and a non-planar top surface.

16. The device of claim 10 further comprising:
an etch stop layer over the first source/drain region and on a sidewall of the gate spacers;
a first interlayer dielectric over the etch stop layer;
a second interlayer dielectric over the first interlayer dielectric; and
a first conductive contact extending through the first and second interlayer dielectrics and the etch stop layer, the first conductive contact being electrically coupled to the first source/drain region.

17. The device of claim 10, wherein the first insulator layer comprises silicon oxide, silicon nitride, hafnium oxide, or a combination thereof.

18. A device comprising:
a first fin extending upwards from a substrate;
a first gate over and along sidewalls of a first fin;
a first gate spacer along a sidewall of the first gate;
a first source/drain region in the first fin, the first source/drain region comprising:

a non-conformal insulator layer;
a first epitaxial layer over the non-conformal insulator layer and on the first fin; and
a second epitaxial layer on the first epitaxial layer, the first epitaxial layer being between and contacting the first epitaxial layer and the first fin, the second epitaxial layer contacting the non-conformal insulator layer.

19. The device of claim 18, wherein the non-conformal insulator layer is thicker at a bottom than at sides of the first source/drain region.

20. The device of claim 18 further comprising:
an air gap between the non-conformal insulator layer and the second epitaxial layer.

* * * * *